(12) United States Patent
Sasaki et al.

(10) Patent No.: US 7,906,838 B2
(45) Date of Patent: *Mar. 15, 2011

(54) ELECTRONIC COMPONENT PACKAGE AND METHOD OF MANUFACTURING SAME

(75) Inventors: Yoshitaka Sasaki, Milpitas, CA (US); Tatsushi Shimizu, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 260 days.

This patent is subject to a terminal disclaimer.

(21) Appl. No.: 11/878,282

(22) Filed: Jul. 23, 2007

(65) Prior Publication Data

US 2009/0026603 A1    Jan. 29, 2009

(51) Int. Cl.
*H01L 23/02* (2006.01)
*H01L 21/00* (2006.01)

(52) U.S. Cl. ......... 257/678; 257/E23.001; 257/E21.499; 438/106

(58) Field of Classification Search .................. 257/693, 257/696, 691, 620, 777, 678, E23.01, E21.505, 257/700, 730, E23.001, E21.499; 438/107, 438/106, 109; 29/592.1, 846, 830, 835, 854
See application file for complete search history.

(56) References Cited

U.S. PATENT DOCUMENTS

| | | | | |
|---|---|---|---|---|
| 5,475,264 A * | 12/1995 | Sudo et al. | ..................... | 257/723 |
| 5,926,380 A | 7/1999 | Kim | | |
| 2002/0180010 A1 * | 12/2002 | Tsubosaki et al. | ............ | 257/667 |

FOREIGN PATENT DOCUMENTS

| | | |
|---|---|---|
| JP | A-2001-035993 | 2/2001 |
| JP | A-2001-244403 | 9/2001 |
| JP | A-2003-163324 | 6/2003 |

OTHER PUBLICATIONS

U.S. Appl. No. 11/706,376, filed Feb. 15, 2007 in the name of Yoshitaka Sasaki et al.
U.S. Appl. No. 11/806,047, filed May 19, 2007 in the name of Yoshitaka Sasaki et al.

* cited by examiner

*Primary Examiner* — Thomas L Dickey
*Assistant Examiner* — Nikolay Yushin
(74) *Attorney, Agent, or Firm* — Oliff & Berridge, PLC

(57) ABSTRACT

An electronic component package includes: a base having a top surface and a side surface; and a plurality of layer portions stacked on the top surface of the base, each of the layer portions including at least one electronic component chip. The base includes a plurality of external connecting terminals, and a retainer for retaining the plurality of external connecting terminals. Each of the external connecting terminals has an end face located at the side surface of the base. At least one of a plurality of electronic component chips that the plurality of layer portions include is electrically connected to at least one of the external connecting terminals.

28 Claims, 14 Drawing Sheets

ELECTRONIC COMPONENT PACKAGE AND METHOD OF MANUFACTURING SAME

BACKGROUND OF THE INVENTION

1. Field of the Invention

The present invention relates to an electronic component package including a plurality of chips and a plurality of external connecting terminals and a method of manufacturing the same, and to an electronic component package substructure that is used for manufacturing the electronic component package.

2. Description of the Related Art

A reduction in weight and an improvement in performance have been desired for mobile apparatuses represented by cellular phones and notebook personal computers. Higher integration of electronic components used for mobile apparatuses has been sought, accordingly.

A system large-scale integrated circuit (LSI) and a multi-chip module have been known as highly integrated electronic components. The system LSI is a single integrated circuit (IC) in which functions of various electronic components are incorporated. The multi-chip module is a module made up of a plurality of chips integrated through the use of a wiring substrate, for example.

The system LSI has a benefit that it allows the integration density to be higher and the number of leads to be minimized. On the other hand, the multi-chip module has a benefit that it facilitates the implementation of a single module having desired functions by integrating a plurality of chips having different functions.

A description will now be given of a conventional method of manufacturing an electronic component package including at least one chip and a plurality of external connecting terminals, such as a system LSI or a multi-chip module. In a typical conventional method of manufacturing an electronic component package, at least one chip is mounted on a base such as a wiring substrate prepared for a single electronic component package, a terminal of the chip is connected to an external connecting terminal, and the connecting portion between the terminal of the chip and the external connecting terminal is sealed. The connection between the terminal of the chip and the external connecting terminal is performed by wire bonding or flip-chip, for example. In a case where flip-chip is employed, the terminal of the chip and the external connecting terminal are connected to each other through a lead inside the wiring substrate. Wiring among chips in the multi-chip module is also performed by wire bonding or flip-chip, for example.

JP 2001-035993A discloses a multi-chip module in which a bonding pad connected to a chip is connected to a lead that is an external connecting terminal by wire bonding. JP 2001-035993A further discloses a technique of forming inter-chip wiring and the bonding pad through a wire-forming process. According to this publication, the wire-forming process includes a film forming step, a lithography step and an etching step, for example.

JP 2001-244403A discloses a technique wherein inter-chip wiring and pads for external connection of a multi-chip module are formed through a wafer process. According to this publication, the wafer process includes a series of steps of forming an insulating layer, forming via holes, embedding plug metals, flattening, forming films by sputtering, and forming a wiring pattern through photolithography techniques.

U.S. Pat. No. 5,926,380 discloses a method of manufacturing a chip-size semiconductor package as will now be described. In this method, first, a lead frame is bonded to the top surface of a wafer in which a plurality of semiconductor chips each having a plurality of pads on the surface thereof and aligned with chip partition lines are formed. Next, leads of the lead frame and the pads of the semiconductor chips are connected to each other by wire bonding. Next, the top surfaces of the leads closer to the base ends are exposed and the top and bottom surfaces of the wafer are molded. Next, conductive metallic plating is performed on the exposed top surfaces of the leads closer to the base ends. Next, the wafer and the lead frame are cut to complete the semiconductor packages.

In the typical conventional method of manufacturing an electronic component package, a series of steps, such as mounting of at least one chip on the base, connection of the terminals of the chip to external connecting terminals, and sealing of the connecting portions between the terminals of the chip and the external connecting terminals, are performed for each electronic component package. This typical method has a problem that it is difficult to mass-produce electronic component packages at low cost in a short period of time.

The method of manufacturing a chip-size semiconductor package disclosed in U.S. Pat. No. 5,926,380 makes it possible to mass-produce chip-size semiconductor packages at low cost. In this method, however, to alter the specifications of semiconductor chips, it is required to start with design of a wafer including a plurality of semiconductor chips. Therefore, the method has a problem that it is difficult to respond to alterations to the specifications flexibly and quickly. In addition, it is impossible to manufacture multi-chip modules through this method.

JP 2003-163324A discloses a method of manufacturing a three-dimensional layered semiconductor device as will now be described. In this method, first, a plurality of three-dimensional layered semiconductor devices are formed on a provisional substrate. Next, the provisional substrate is removed from the aggregate of the three-dimensional layered semiconductor devices. Next, the aggregate of the three-dimensional layered semiconductor devices is diced to separate the plurality of three-dimensional layered semiconductor devices from one another. In this method, external electrodes are formed on at least one of the top surface and the bottom surface of each of the three-dimensional layered semiconductor devices.

The method of manufacturing a three-dimensional layered semiconductor device disclosed in JP 2003-163324A enables mass production of three-dimensional layered semiconductor devices capable of achieving higher integration. According to this method, however, it is necessary to perform the steps of removing the provisional substrate and forming the external electrodes, and therefore this method has a problem that a large number of steps are required.

OBJECT AND SUMMARY OF THE INVENTION

It is an object of the present invention to provide an electronic component package and a method of manufacturing the same, and an electronic component package substructure used for manufacturing the electronic component package that make it possible to mass-produce electronic component packages capable of achieving higher integration at low cost in a short period of time, and make it possible to respond to alterations to specifications flexibly and quickly.

An electronic component package of the present invention includes: a base having a top surface and a side surface; and a plurality of layer portions stacked on the top surface of the base, each of the layer portions including at least one electronic component chip. The base includes a plurality of external connecting terminals and a retainer for retaining the plurality of external connecting terminals. Each of the external connecting terminals has an end face located at the side surface of the base. At least one of a plurality of electronic component chips that the plurality of layer portions include is electrically connected to at least one of the external connecting terminals.

In the electronic component package of the invention, the base may further include a chip bonding conductor layer to which the at least one electronic component chip included in one of the layer portions that is closest to the base is bonded.

In the electronic component package of the invention, each of the electronic component chips may have a plurality of electrodes, and one of the layer portions that is closest to the base may further include at least one terminal connecting portion for electrically connecting at least one of the electrodes of the electronic component chip included therein to at least one of the external connecting terminals.

In the electronic component package of the invention, each of the electronic component chips may have a plurality of electrodes, and the electronic component package may include at least one terminal connecting line for electrically connecting at least one of the electrodes of the electronic component chips included in the plurality of layer portions except the one closest to the base to at least one of the external connecting terminals. The at least one terminal connecting line may include a columnar conductor that penetrates at least one of the layer portions.

In the electronic component package of the invention, each of the electronic component chips may have a plurality of electrodes, and at least one of the layer portions may include: a plurality of electronic component chips; and at least one inter-chip connecting portion for electrically connecting the electrodes of the plurality of electronic component chips to each other.

The at least one of the layer portions that includes the plurality of electronic component chips may further include an insulating layer that covers the plurality of electronic component chips and that has a flattened top surface. In this case, the insulating layer may have an opening for exposing the electrodes that are connected to each other through the at least one inter-chip connecting portion, and the at least one inter-chip connecting portion may include a portion disposed on the insulating layer and a portion inserted to the opening. Furthermore, the insulating layer may include: a resin insulating film that covers the plurality of electronic component chips; and an inorganic insulating film that covers the resin insulating film and that has a flattened top surface.

In the electronic component package of the invention, each of the electronic component chips may have a plurality of electrodes, and the electronic component package may include at least one inter-chip connecting line for connecting the electrodes of two of the electronic component chips included in different ones of the layer portions to each other. The at least one inter-chip connecting line may include a columnar conductor that penetrates at least one of the layer portions.

In the electronic component package of the invention, the plurality of layer portions except the one farthest from the base may include a flattened layer having a top surface that is flattened and that touches one of the layer portions disposed thereon. The flattened layer may include a resin insulating film and an inorganic insulating film that covers the resin insulating film and that has a flattened top surface.

In the electronic component package of the invention, the one of the layer portions farthest from the base may further include a protection layer that covers the at least one electronic component chip included therein.

The electronic component package of the invention may further include a plurality of terminal conductor films disposed on the side surface of the base and respectively connected to the end faces of the external connecting terminals.

The electronic component package of the invention may further include a plurality of terminal pins respectively connected to the end faces of the external connecting terminals.

A method of manufacturing the electronic component package of the invention includes the steps of: fabricating a wafer that incorporates a plurality of sets of the external connecting terminals corresponding to a plurality of electronic component packages and a wafer main body for retaining the plurality of sets of the external connecting terminals, the wafer including a plurality of pre-base portions that will be separated from one another later so that each of them will thereby become the base; fabricating an electronic component package substructure including the wafer and a plurality of sets of the layer portions by forming the plurality of sets of the layer portions on the wafer such that the plurality of layer portions are disposed on each of the pre-base portions of the wafer; and cutting the electronic component package substructure so that portions including the respective pre-base portions and the plurality of layer portions disposed thereon are separated from one another to thereby form the plurality of electronic component packages.

In the method of manufacturing the electronic component package of the invention, the wafer may further incorporate a plurality of chip bonding conductor layers to each of which the at least one electronic component chip included in one of the layer portions that is closest to the base is to be bonded.

In the method of manufacturing the electronic component package of the invention, each of the electronic component chips may have a plurality of electrodes, and one of the layer portions that is closest to the base may further include at least one terminal connecting portion for electrically connecting at least one of the electrodes of the electronic component chip included therein to at least one of the external connecting terminals. In this case, the step of fabricating the electronic component package substructure includes the step of forming a plurality of terminal connecting portions corresponding to the plurality of electronic component packages.

In the method of manufacturing the electronic component package of the invention, each of the electronic component chips may have a plurality of electrodes, and the electronic component package may include at least one terminal connecting line for electrically connecting at least one of the electrodes of the electronic component chips included in the plurality of layer portions except the one closest to the base to at least one of the external connecting terminals. In this case, the step of fabricating the electronic component package substructure includes the step of forming a plurality of terminal connecting lines corresponding to the plurality of electronic component packages.

Each of the terminal connecting lines may include a columnar conductor that penetrates at least one of the layer portions. In this case, the step of forming the plurality of terminal connecting lines may include the steps of forming a plurality of columnar conductors corresponding to the plurality of electronic component packages; forming an insulating layer so as to cover the plurality of columnar conductors; and polishing the insulating layer so that the plurality of columnar conductors are exposed.

In the method of manufacturing the electronic component package of the invention, each of the electronic component chips may have a plurality of electrodes, and at least one of the layer portions may include: a plurality of electronic component chips; and at least one inter-chip connecting portion for electrically connecting the electrodes of the plurality of electronic component chips to each other. In this case, the step of fabricating the electronic component package substructure includes the step of forming a plurality of inter-chip connecting portions corresponding to the plurality of electronic component packages.

The at least one of the layer portions that includes the plurality of electronic component chips may further include an insulating layer that covers the plurality of electronic component chips and that has a flattened top surface. In this case, the insulating layer may have an opening for exposing the electrodes that are connected to each other through the at least one inter-chip connecting portion, and the at least one inter-chip connecting portion may include a portion disposed on the insulating layer and a portion inserted to the opening. In this case, the step of fabricating the electronic component package substructure includes the step of forming the insulating layer before the plurality of inter-chip connecting portions are formed.

The insulating layer may include: a resin insulating film that covers the plurality of electronic component chips; and an inorganic insulating film that covers the resin insulating film and that has a flattened top surface. In this case, the step of forming the insulating layer includes the steps of: forming the resin insulating film; forming the inorganic insulating film so as to cover the resin insulating film; flattening the top surface of the inorganic insulating film; and forming the opening in the resin insulating film and the inorganic insulating film.

In the method of manufacturing the electronic component package of the invention, each of the electronic component chips may have a plurality of electrodes, and the electronic component package may include at least one inter-chip connecting line for connecting the electrodes of two of the electronic component chips included in different ones of the layer portions to each other. In this case, the step of fabricating the electronic component package substructure includes the step of forming a plurality of inter-chip connecting lines corresponding to the plurality of electronic component packages.

Each of the inter-chip connecting lines may include a columnar conductor that penetrates at least one of the layer portions. In this case, the step of forming the plurality of inter-chip connecting lines may include the steps of: forming a plurality of columnar conductors corresponding to the plurality of electronic component packages; forming an insulating layer so as to cover the plurality of columnar conductors; and polishing the insulating layer so that the plurality of columnar conductors are exposed.

In the method of manufacturing the electronic component package of the invention, the plurality of layer portions except the one farthest from the base may include a flattened layer having a top surface that is flattened and that touches one of the layer portions disposed thereon. In this case, the step of fabricating the electronic component package substructure includes the step of forming the flattened layer.

The flattened layer may include: a resin insulating film; and an inorganic insulating film that covers the resin insulating film and that has a flattened top surface. In this case, the step of forming the flattened layer may include the steps of: forming the resin insulating film; forming the inorganic insulating film so as to cover the resin insulating film; and flattening the top surface of the inorganic insulating film.

In the method of manufacturing the electronic component package of the invention, the one of the layer portions farthest from the base may further include a protection layer that covers the at least one electronic component chip included therein. In this case, the step of fabricating the electronic component package substructure includes the step of forming the protection layer.

In the method of manufacturing the electronic component package of the invention, the electronic component package may further include a plurality of terminal conductor films disposed on the side surface of the base and respectively connected to the end faces of the external connecting terminals. In this case, the method of manufacturing the electronic component package further includes the step of forming the plurality of terminal conductor films after the step of cutting the electronic component package substructure.

In the method of manufacturing the electronic component package of the invention, the electronic component package may further include a plurality of terminal pins respectively connected to the end faces of the external connecting terminals. In this case, the method of manufacturing the electronic component package further includes the step of connecting the terminal pins to the end faces of the external connecting terminals after the step of cutting the electronic component package substructure.

An electronic component package substructure of the present invention is used to manufacture the electronic component package of the invention. The electronic component package substructure of the invention includes a wafer that incorporates a plurality of sets of the external connecting terminals corresponding to a plurality of electronic component packages and a wafer main body for retaining the plurality of sets of the external connecting terminals, the wafer including a plurality of pre-base portions that will be separated from one another later so that each of them will thereby become the base, the substructure further including a plurality of sets of the layer portions disposed on the wafer such that the plurality of layer portions are disposed on each of the pre-base portions of the wafer.

In the electronic component package substructure of the invention, the wafer may further incorporate a plurality of chip bonding conductor layers to each of which the at least one electronic component chip included in one of the layer portions that is closest to the base is to be bonded.

In the present invention, each of the electronic component chips may have a plurality of electrodes, and one of the layer portions that is closest to the base may further include at least one terminal connecting portion for electrically connecting at least one of the electrodes of the electronic component chip included therein to at least one of the external connecting terminals. In this case, the plurality of sets of the layer portions of the electronic component package substructure include a plurality of terminal connecting portions corresponding to the plurality of electronic component packages.

In the present invention, each of the electronic component chips may have a plurality of electrodes, and the electronic component package may include at least one terminal connecting line for electrically connecting at least one of the electrodes of the electronic component chips included in the plurality of layer portions except the one closest to the base to at least one of the external connecting terminals. In this case, the plurality of sets of the layer portions of the electronic component package substructure include a plurality of terminal connecting lines corresponding to the plurality of electronic component packages. Each of the terminal connecting lines may include a columnar conductor that penetrates at least one of the layer portions.

In the present invention, each of the electronic component chips may include a plurality of electrodes, and at least one of the layer portions may include a plurality of electronic component chips and at least one inter-chip connecting portion for electrically connecting the electrodes of the plurality of electronic component chips to each other. In this case, the plurality of sets of the layer portions of the electronic component package substructure include a plurality of inter-chip connecting portions corresponding to the plurality of electronic component packages.

The at least one of the layer portions that includes the plurality of electronic component chips may further include an insulating layer that covers the plurality of electronic component chips and that has a flattened top surface. This insulating layer may have an opening for exposing the electrodes that are connected to each other through the at least one inter-chip connecting portion, and the at least one inter-chip connecting portion may include a portion disposed on the insulating layer and a portion inserted to the opening. Furthermore, the insulating layer may include: a resin insulating film that covers the plurality of electronic component chips; and an inorganic insulating film that covers the resin insulating film and that has a flattened top surface.

In the present invention, each of the electronic component chips may have a plurality of electrodes, and the electronic component package may include at least one inter-chip connecting line for connecting the electrodes of two of the electronic component chips included in different ones of the layer portions to each other. In this case, the plurality of sets of the layer portions of the electronic component package substructure include a plurality of inter-chip connecting lines corresponding to the plurality of electronic component packages. Each of the inter-chip connecting lines may include a columnar conductor that penetrates at least one of the layer portions.

In the electronic component package substructure of the invention, the plurality of layer portions except the one farthest from the base may include a flattened layer having a top surface that is flattened and that touches one of the layer portions disposed thereon. The flattened layer may include: a resin insulating film; and an inorganic insulating film that covers the resin insulating film and that has a flattened top surface.

In the electronic component package substructure of the invention, the one of the layer portions farthest from the base may further include a protection layer that covers the at least one electronic component chip included therein.

The electronic component package or the method of manufacturing the same, or the electronic component package substructure of the present invention allows electronic component packages capable of achieving higher integration to be mass-produced at low cost in a short period of time, and also makes it possible to respond to alterations to specifications flexibly and quickly.

Other and further objects, features and advantages of the invention will appear more fully from the following description.

DETAILED DESCRIPTION OF THE PREFERRED EMBODIMENT

Figure 1:
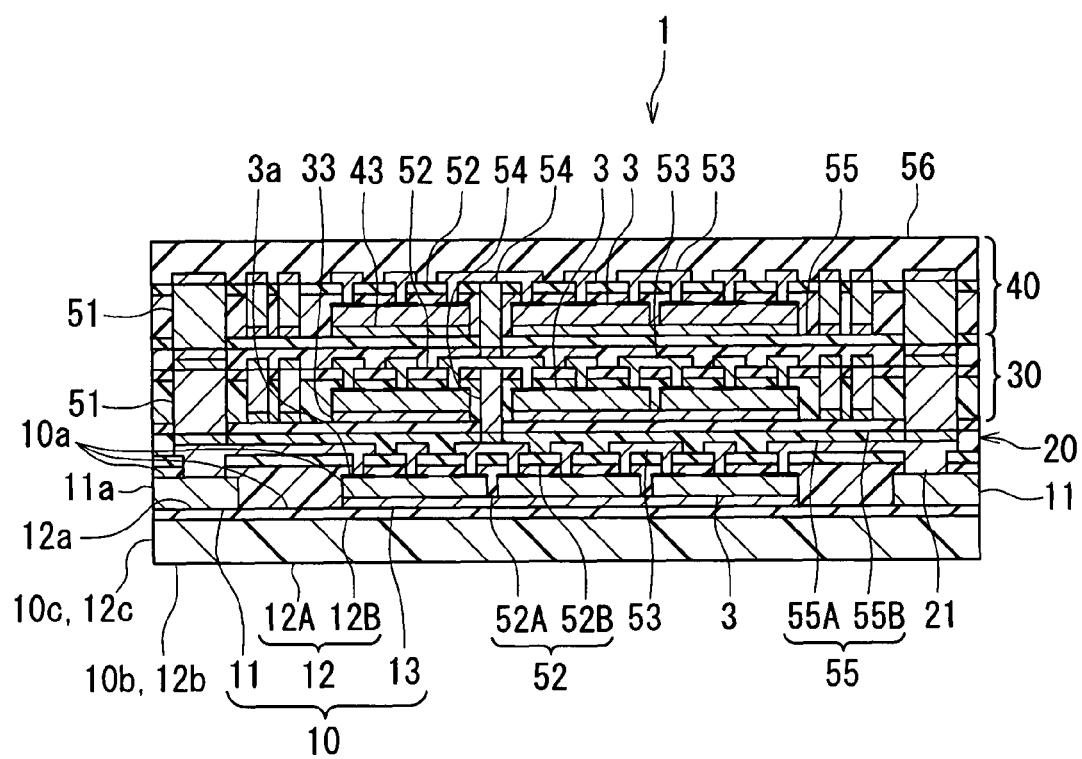
FIG. 1 is a cross-sectional view of an electronic component package of an embodiment of the invention.

An embodiment of the present invention will now be described in detail with reference to the drawings. Reference is first made to FIG. 1 to describe the configuration of an electronic component package of the embodiment. FIG. 1 is a cross-sectional view of the electronic component package of the embodiment. As illustrated in FIG. 1, the electronic component package 1 of the embodiment includes a base 10 and a plurality of layer portions stacked on the base 10. FIG. 1 illustrates an example in which the electronic component package 1 includes three layer portions 20, 30 and 40. In this example, the layer portions 20, 30 and 40 are stacked in this order on the base 10. Alternatively, the number of the plurality of layer portions that the electronic component package 1 includes may be two, or may be equal to or greater than four. The electronic component package 1 is rectangular-solid-shaped, for example. In this case, the base 10 has a top surface 10a, a bottom surface 10b, and four side surfaces 10c.

The base 10 includes a plurality of external connecting terminals 11, and a retainer 12 for retaining the plurality of external connecting terminals 11. At least a portion of the retainer 12 that includes the surface touching the external connecting terminals 11 is made of an insulating material or a high-resistance material. The retainer 12 can be made of a resin, ceramic, or glass, for example. Alternatively, the retainer 12 may be made of glass fibers set with a resin. The retainer 12 may also be made of a structure with an insulating film formed on one of surfaces of a plate made of a semiconductor material such as silicon.

In the example illustrated in FIG. 1, the retainer 12 has a first layer 12A and a second layer 12B disposed on the first layer 12A. The first layer 12A is made of a resin, ceramic, glass, glass fibers set with a resin, or a semiconductor material, for example. The second layer 12B is made of an inorganic insulating material such as $Al_2O_3$ or $SiO_2$. The second layer 12B has a thickness within a range of 0.1 to 0.5 µm, for example.

Furthermore, in the example illustrated in FIG. 1, the retainer 12 has a top surface 12a, a bottom surface 12b, and four side surfaces 12c. The plurality of external connecting terminals 11 are located on the top surface 12a of the retainer 12. The external connecting terminals 11 have their respective end faces 11a located at the side surfaces 10c of the base 10.

Each of the layer portions 20, 30 and 40 includes at least one electronic component chip (hereinafter simply referred to as a chip) 3. At least one of a plurality of chips 3 that the plurality of layer portions 20, 30 and 40 include is electrically connected to at least one of the external connecting terminals 11. The chips 3 may be semiconductor integrated circuit elements or other circuit elements, or may be sensors or actuators formed by using the micro-electro mechanical systems (MEMS), for example.

The base 10 may include a chip bonding conductor layer 13 to which the at least one chip 3 included in the layer portion 20 closest to the base 10 is bonded. In this case, the top surface 10a of the base 10 is made up of a portion of the top surface 12a of the retainer 12 that is not covered with the external connecting terminals 11 and the chip bonding conductor layer 13; the top surfaces of the external connecting terminals 11; and the top surface of the chip bonding conductor layer 13.

Each chip 3 has a plurality of electrodes 3a. The layer portion 20 closest to the base 10 may include at least one terminal connecting portion 21 for electrically connecting at least one of the electrodes 3a of the chip 3 included therein to at least one of the external connecting terminals 11.

The electronic component package 1 may include at least one terminal connecting line for electrically connecting at least one of the electrodes 3a of the chips 3 included in the plurality of layer portions 20, 30 and 40 except the layer portion 20 closest to the base 10 to at least one of the external connecting terminals 11. The at least one terminal connecting line may include a columnar conductor 51 that penetrates at least one of the layer portions.

At least one of the layer portions 20, 30 and 40 may include a plurality of chips 3 and at least one inter-chip connecting portion 53 for electrically connecting the electrodes 3a of the plurality of chips 3 to each other. In the example illustrated in FIG. 1, each of the layer portions 20, 30 and 40 includes a plurality of chips 3 and at least one inter-chip connecting portion 53.

The layer portion that includes a plurality of chips 3 may further include an insulating layer 52 that covers the plurality of chips 3 and that has a flattened top surface. In this case, the insulating layer 52 has an opening for exposing the plurality of electrodes 3a connected to each other through the inter-chip connecting portion 53, and the inter-chip connecting portion 53 includes a portion disposed on the insulating layer 52 and a portion inserted to the opening. The insulating layer 52 may include: a resin insulating film 52A that covers the plurality of chips 3; and an inorganic insulating film 52B that covers the resin insulating film 52A and that has a flattened top surface. The resin insulating film 52A is made of a resin such as a polyimide resin. The inorganic insulating film 52B is made of an inorganic insulating material such as $Al_2O_3$ or $SiO_2$.

The electronic component package 1 may include at least one inter-chip connecting line for connecting the electrodes 3a of two of the chips 3 included in different ones of the layer portions to each other. The at least one inter-chip connecting line may include a columnar conductor 54 that penetrates at least one of the layer portions.

Of the plurality of layer portions 20, 30 and 40, the layer portions 20 and 30 other than the layer portion 40 farthest from the base 10 may each include a flattened layer 55 having a top surface that is flattened and that touches one of the layer portions disposed thereon. The flattened layer 55 may include: a resin insulating film 55A; and an inorganic insulating film 55B that covers the resin insulating film 55A and that has a flattened top surface. The resin insulating film 55A is made of a resin such as a polyimide resin. The inorganic insulating film 55B is made of an inorganic insulating material such as $Al_2O_3$ or $SiO_2$.

The layer portion 30 may include a chip bonding conductor layer 33 to which the at least one chip 3 included therein is bonded. In this case, the chip bonding conductor layer 33 is disposed on the top surface of the flattened layer 55 of the layer portion 20. Similarly, the layer portion 40 may include a chip bonding conductor layer 43 to which the at least one chip 3 included therein is bonded. In this case, the chip bonding conductor layer 43 is disposed on the top surface of the flattened layer 55 of the layer portion 30.

The layer portion 40 farthest from the base 10 may further include a protection layer 56 that covers the at least one chip 3 included therein.

The terminal connecting portion 21, the terminal connecting line, the inter-chip connecting portion 53 and the inter-chip connecting line can be made of any of Cu, Ni, Cr, Fe and Au, for example. Of these materials, Cu and Au are particularly preferable because of their high conductivity.

Figure 20:
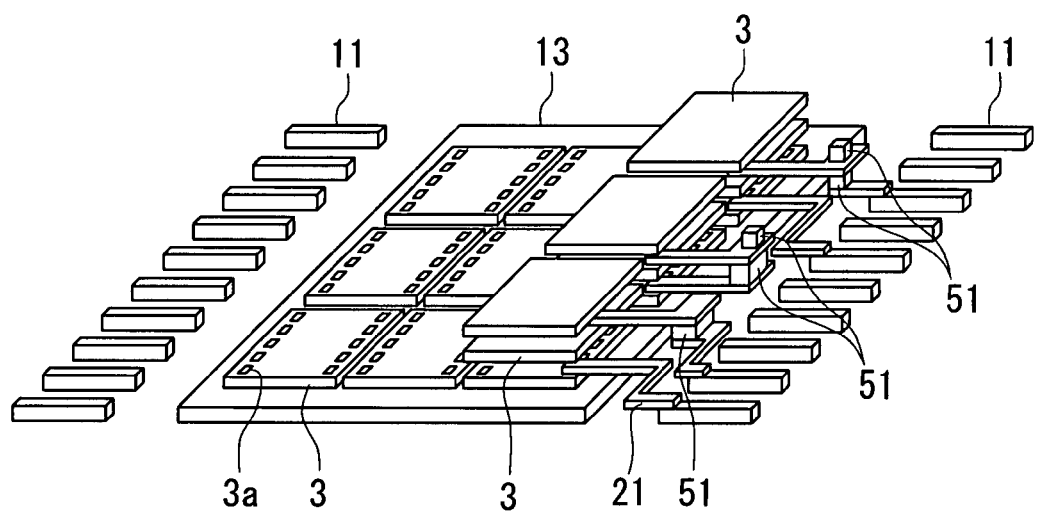
FIG. 20 is a perspective view of a main part of the electronic component package of the embodiment of the invention.

FIG. 20 illustrates a main part of the electronic component package 1 of the embodiment.

Figure 2:
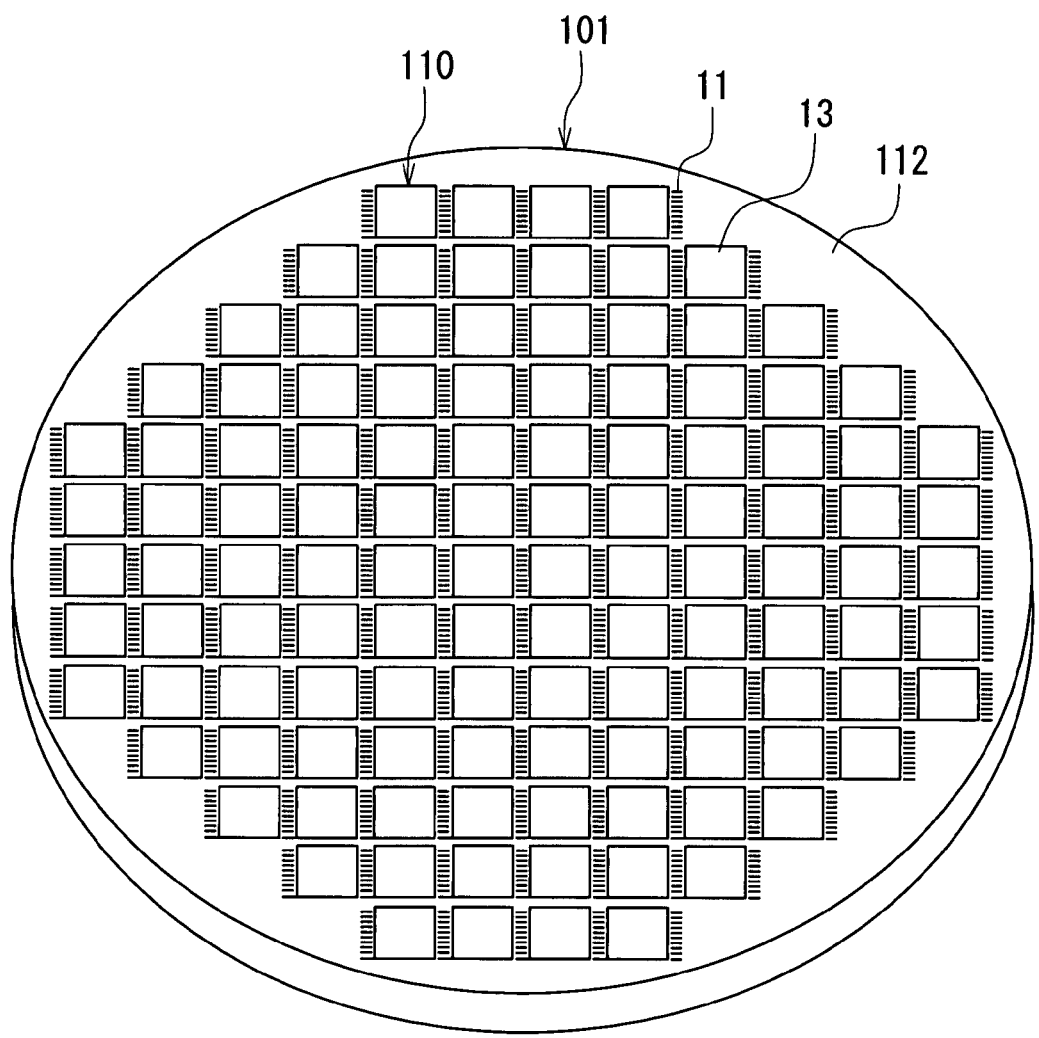
FIG. 2 is an explanatory view illustrating an electronic component package wafer of the embodiment of the invention.
Figure 3:
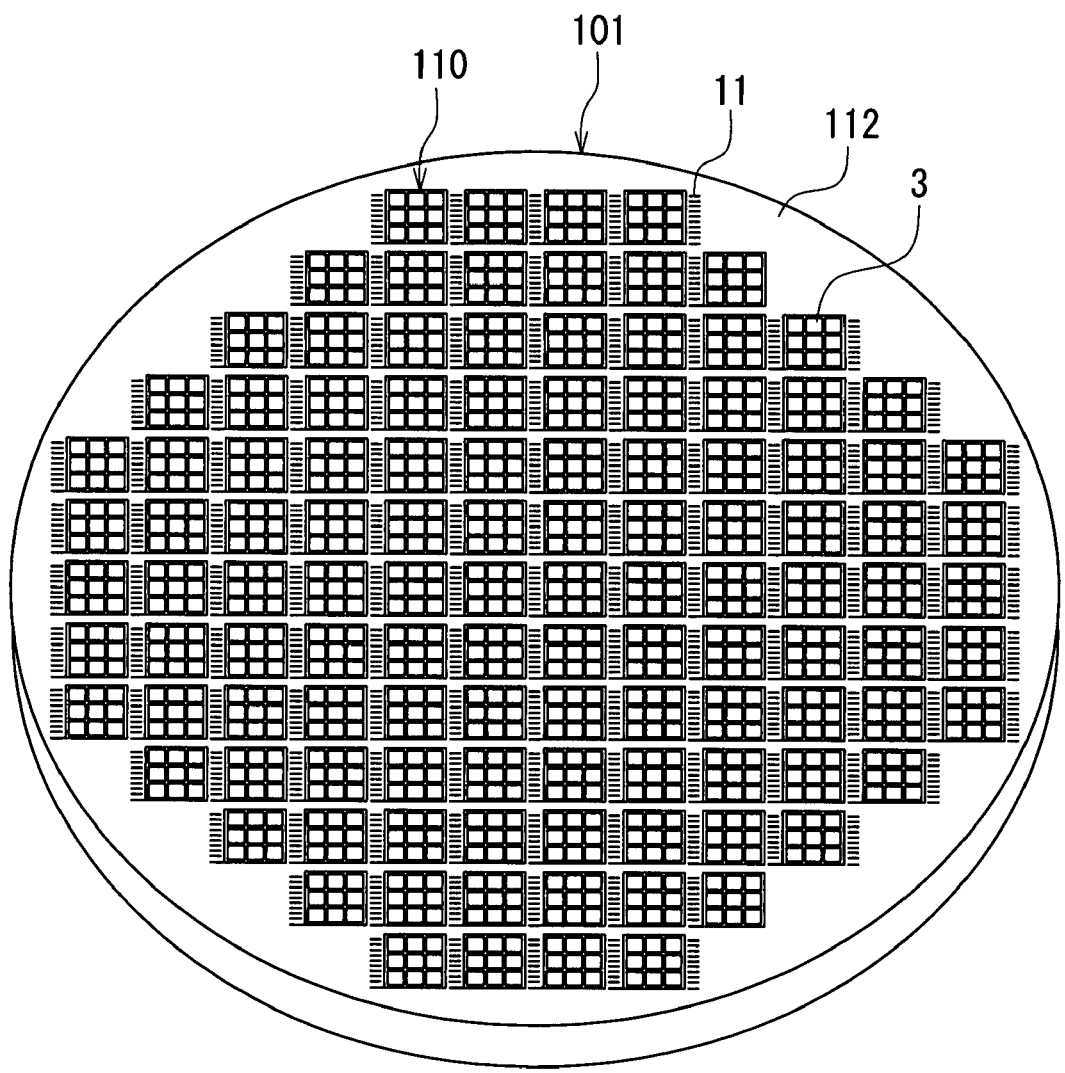
FIG. 3 is an explanatory view for explaining a method of manufacturing the electronic component package of the embodiment of the invention.
Figure 4:
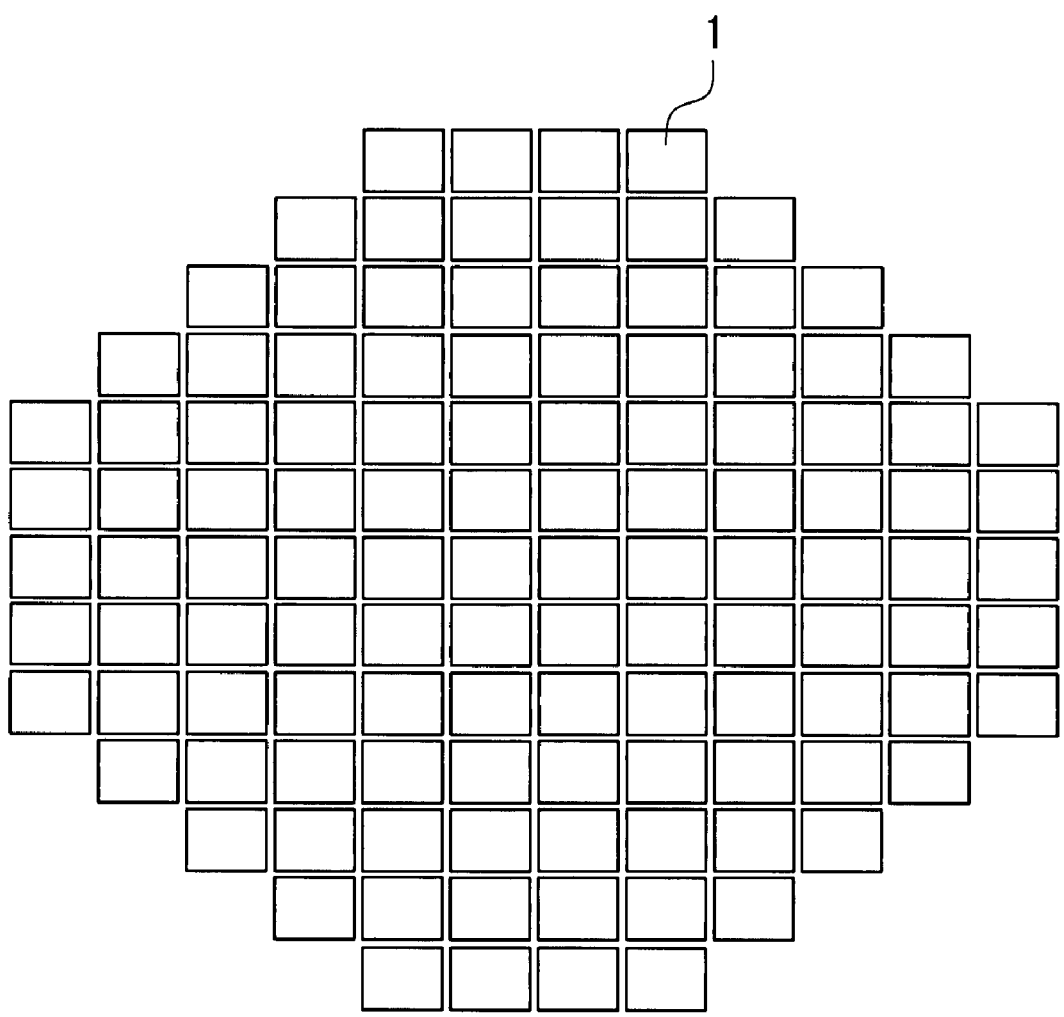
FIG. 4 is an explanatory view for explaining the method of manufacturing the electronic component package of the embodiment of the invention.

Reference is now made to FIG. 2 to FIG. 4 to describe an outline of a method of manufacturing the electronic component package 1 of the embodiment. FIG. 2 illustrates a first step of the method of manufacturing the electronic component package of the embodiment. In this step, an electronic component package wafer (hereinafter simply referred to as a wafer) 101 is fabricated. The wafer 101 incorporates: a plurality of sets of the external connecting terminals 11 corresponding to a plurality of electronic component packages 1;

and a wafer main body 112 for retaining the plurality of sets of the external connecting terminals 11. The wafer 101 does not include any circuit element. The wafer 101 includes a plurality of pre-base portions 110 that will be separated from one another later so that each of them will thereby become the base 10 of the electronic component package 1. The wafer main body 112 is cut when the plurality of pre-base portions 110 are separated from one another, and thereby becomes a plurality of retainers 12.

The plurality of pre-base portions 110 are arranged such that a plurality of ones of the portions 110 are aligned in vertical and horizontal directions. In the example illustrated in FIG. 2, in each of the pre-base portions 110, a plurality of external connecting terminals 11 are disposed on both sides opposed to each other in the horizontal direction. In the example illustrated in FIG. 2, at the boundary between two of the pre-base portions 110 adjacent to each other along the horizontal direction, among a plurality of external connecting terminals 11 of the adjacent two of the pre-base portions 110, the ones closer to the boundary are coupled to each other. FIG. 2 illustrates an example in which the wafer 101 is circular-plate-shaped. However, the wafer 101 may have any shape, and may be shaped like a plate whose top and bottom surfaces are rectangular, for example.

The wafer 101 illustrated in FIG. 2 further incorporates a plurality of chip bonding conductor layers 13 to each of which the at least one chip 3 included in the layer portion 20 closest to the base 10 is to be bonded. In the example illustrated in FIG. 2, one chip bonding conductor layer 13 is provided for each of the pre-base portions 110. A plurality of external connecting terminals 11 are disposed on both sides of each of the chip bonding conductor layers 13, the sides being opposed to each other in the horizontal direction. However, it is not necessarily required that the wafer 101 incorporate the chip bonding conductor layers 13.

FIG. 3 illustrates the next step. In this step, a plurality of sets of the layer portions 20, 30 and 40 are formed on the wafer 101 such that the layer portions 20, 30 and 40 are disposed on each of the pre-base portions 110 of the wafer 101, to thereby fabricate an electronic component package substructure (hereinafter simply referred to as a substructure) that includes the wafer 101 and the plurality of sets of the layer portions 20, 30 and 40. FIG. 3 illustrates a state in which the at least one chip 3 included in the layer portion 20 is bonded onto each of the chip bonding conductor layers 13 of the wafer 101. In the example illustrated in FIG. 3, each layer portion 20 includes nine chips 3. However, each layer portion 20 can include any number of chips 3. On the stack of layers illustrated in FIG. 3, components of the layer portions 20 other than the chips 3 are formed and then the layer portions 30 and 40 are formed sequentially, whereby the substructure is completed.

FIG. 4 illustrates the next step. In this step, the substructure is cut so that portions including the respective pre-base portions 110 and the plurality of layer portions formed thereon are separated from one another to thereby form a plurality of electronic component packages 1.

Figure 17:
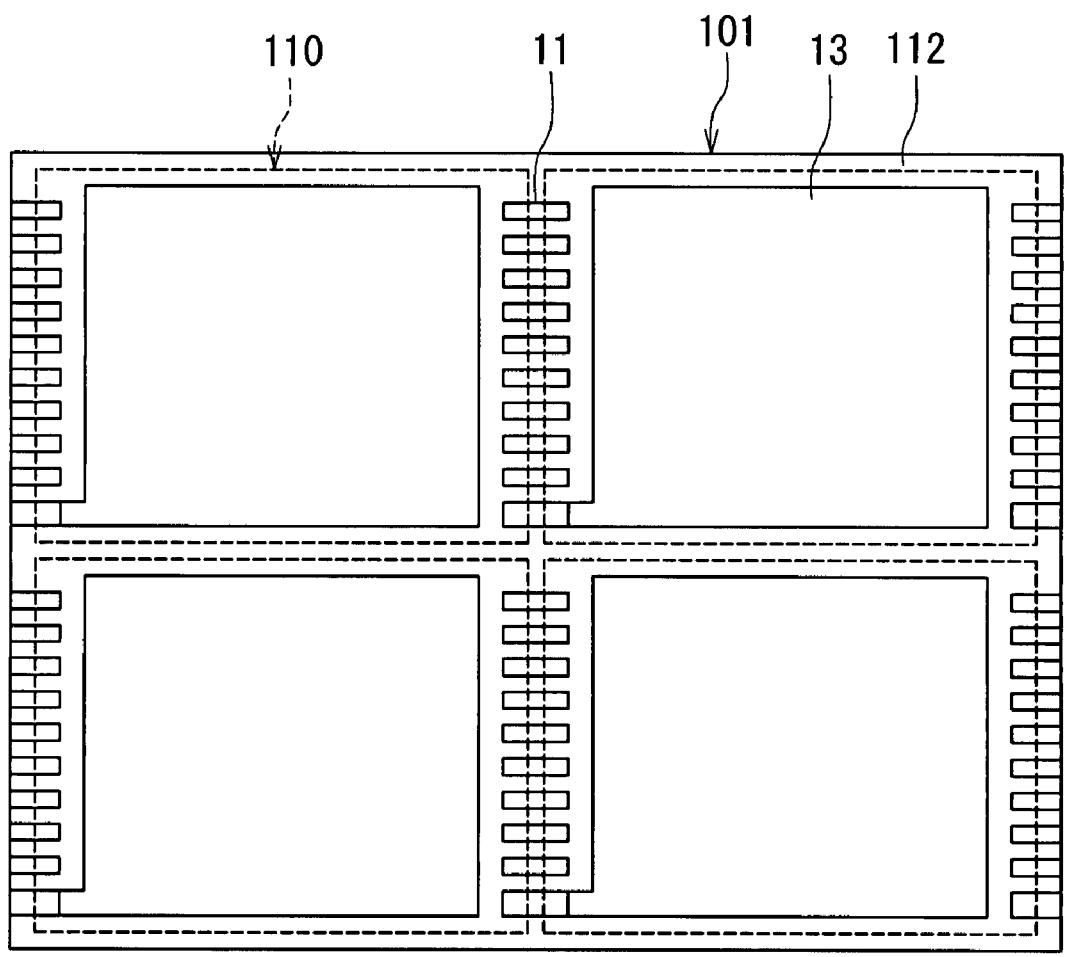
FIG. 17 is a top view illustrating part of a stack of layers fabricated in a step of the method of manufacturing the electronic component package of the embodiment of the invention.
Figure 18:
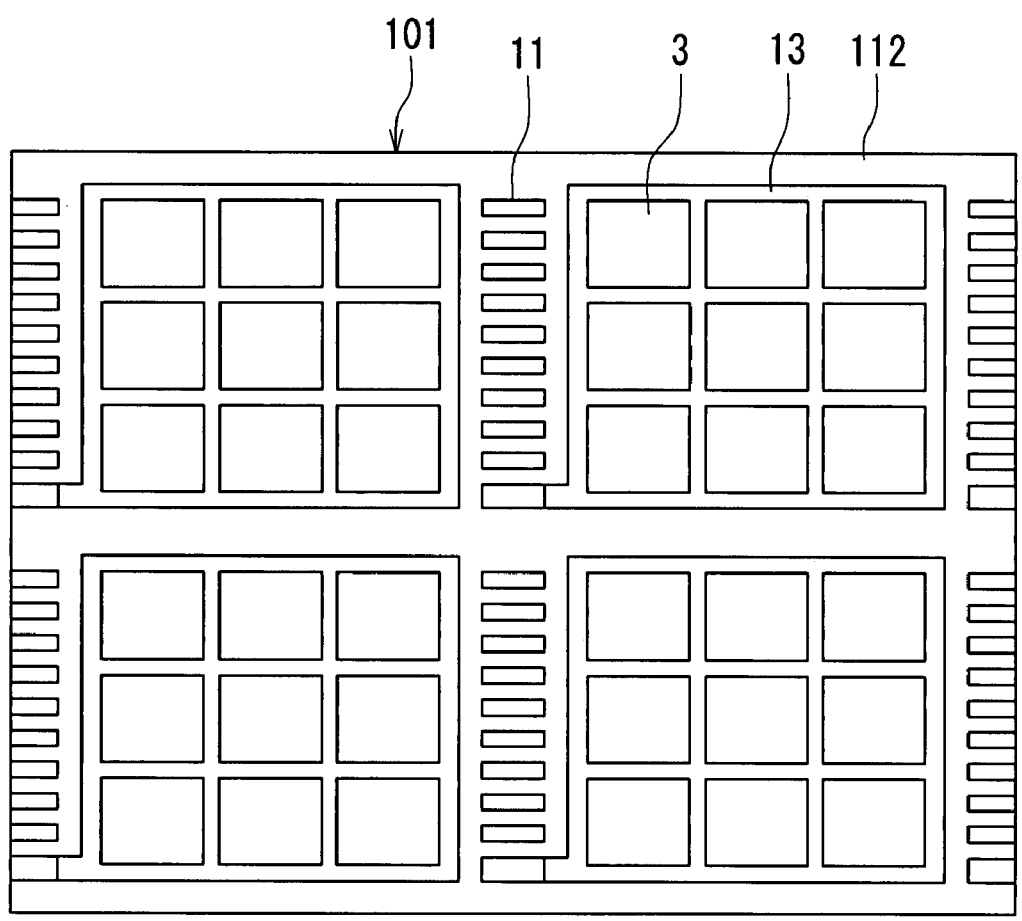
FIG. 18 is a top view illustrating part of a stack of layers obtained in a step that follows the step illustrated in FIG. 17.
Figure 19:
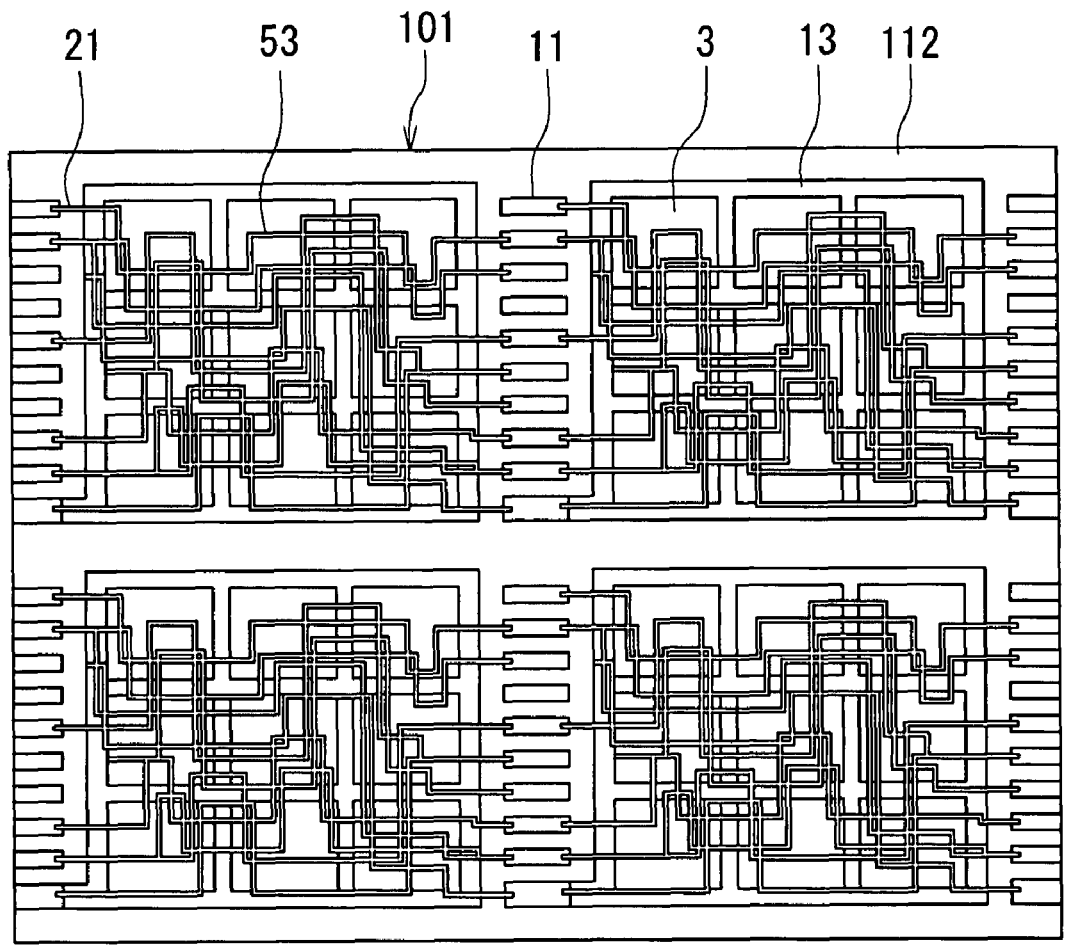
FIG. 19 is a top view illustrating part of a stack of layers obtained in a step that follows the step illustrated in FIG. 18.

Reference is now made to FIG. 5 to FIG. 19 to describe the method of manufacturing the electronic component package 1 of the embodiment in detail. In the cross-sectional views of FIG. 5 to FIG. 16, to show respective portions clearly, the portions are drawn on a scale different from the scale on which the corresponding portions of the top views of FIG. 17 to FIG. 19 are drawn.

Figure 5:
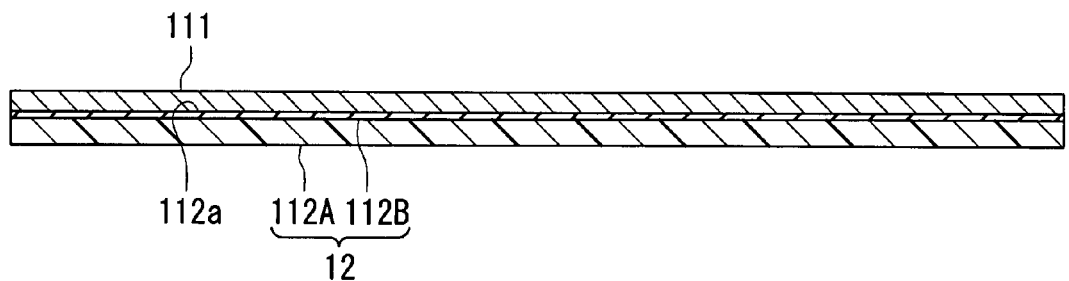
FIG. 5 is a cross-sectional view illustrating part of a stack of layers fabricated in a step of the method of manufacturing the electronic component package of the embodiment of the invention.
Figure 6:
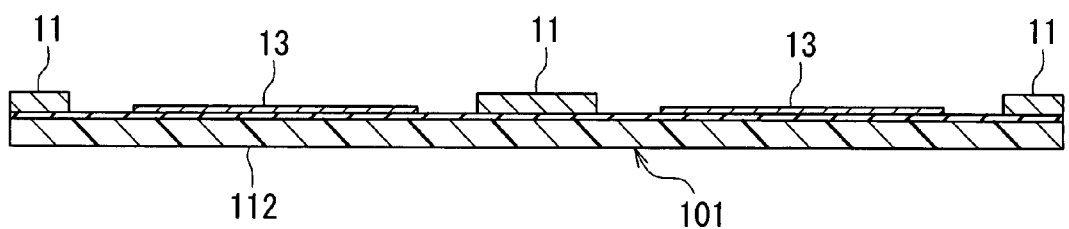
FIG. 6 is a cross-sectional view illustrating part of a stack of layers obtained in a step that follows the step illustrated in FIG. 5.

In the method of manufacturing the electronic component package 1 of the embodiment, first, the wafer 101 is fabricated. An example of the step of fabricating the wafer 101 will now be described with reference to FIG. 5, FIG. 6 and FIG. 17. FIG. 5 is a cross-sectional view of part of a stack of layers fabricated through a step of the method of manufacturing the electronic component package 1 of the embodiment. FIG. 6 is a cross-sectional view of part of a stack of layers fabricated in a step that follows the step of FIG. 5. FIG. 17 is a top view of part of the stack of layers fabricated in a step of the method of manufacturing the electronic component package 1 of the embodiment.

In this step, first, the wafer main body 112 shown in FIG. 5 is fabricated. The wafer main body 112 is in the form of a plate having a flat top surface 112a. At least a portion of the wafer main body 112 including the top surface 112a is made of an insulating material or a high-resistance material. In the example shown in FIG. 5, the wafer main body 112 includes a first layer 112A and a second layer 112B located on the first layer 112A. For example, the first layer 112A is made of a resin, ceramic, glass, glass fibers set with a resin, or a semiconductor material. The second layer 112B is made of an inorganic insulating material such as $Al_2O_3$ or $SiO_2$. The second layer 112B has a thickness within a range of 0.1 to 0.5 μm, for example.

Next, a conductor layer 111 is formed on the top surface 112a of the wafer main body 112, the conductor layer 111 being intended to become the plurality of sets of the external connecting terminals 11 later by being etched partially. The conductor layer 111 has a thickness within a range of 30 to 800 μm, for example.

The conductor layer 111 can be formed by bonding a rolled metal foil to the top surface 112a of the wafer main body 112. In this case, the material of the conductor layer 111 can be Al, Cu, Au, Ni or Ag, for example.

The conductor layer 111 can also be formed by forming a seed layer for plating on the top surface 112a of the wafer main body 112 by sputtering and then forming a plating layer on the seed layer by plating. The seed layer can be made of Cu, Ni, Cr, Fe or Au, for example. The plating layer can be made of any of Cu, Ni, Fe, Ru and Cr, or an alloy containing any of these, or NiFe or CoNiFe, for example.

Next, although not shown, an etching mask is formed on the conductor layer 111. This etching mask covers portions of the conductor layer 111 that are to become the external connecting terminals 11. The etching mask is formed by, for example, patterning a photoresist layer by photolithography. The thickness of the photoresist layer is within a range of 50 to 100 μm, for example. The photoresist layer is formed of a photoresist film, for example. Next, the conductor layer 111 is partially etched by wet etching, for example. Through this etching, as shown in FIG. 6, the plurality of sets of the external connecting terminals 11 are formed of the remaining portions of the conductor layer 111.

Next, as shown in FIG. 6 and FIG. 17, a plurality of chip bonding conductor layers 13 are formed on the top surface 112a of the wafer main body 112 by plating, for example. The chip bonding conductor layers 13 can be made of Cu, for example. The chip bonding conductor layers 13 have a thickness within a range of 1 to 10 μm, for example. In this way, the wafer 101 including the wafer main body 112, the plurality of sets of the external connecting terminals 11 and the plurality of chip bonding conductor layers 13 is fabricated.

The external connecting terminals 11 are greater in thickness than the chip bonding conductor layers 13. There is a difference in level between the top surface of each external connecting terminal 11 and the top surface of each chip bonding conductor layer 13, so that the top surface of each external connecting terminal 11 is located above the top surface of each chip bonding conductor layer 13. It is preferred that this difference in level be equal to or nearly equal to the thickness of the chips 3 that will be disposed on the chip bonding conductor layers 13 later. In a case where the chips 3 are fabricated by using a semiconductor wafer having a diameter of 200 or 300 mm, for example, the thickness of the chips 3 may be nearly equal to the thickness of the semiconductor wafer. In a case where the chips 3 are fabricated by using a semiconductor wafer, the thickness of the chips 3 may be reduced by polishing and thereby thinning the semiconductor wafer. In the case where the chips 3 are fabricated by using a semiconductor wafer, the thickness of the chips 3 is within a range of 30 to 800 μm, for example, but may be greater than 800 μm. It is preferred that the thickness of the chips 3 be within a range of 30 to 250 μm.

The wafer 101 can be fabricated by a method other than the above-described method. For example, the wafer 101 can be fabricated by a method that will now be described. In this method, first, a seed layer for plating is formed on the top surface 112a of the wafer main body 112 by sputtering. Next, a plurality of first plating layers to become portions of the external connecting terminals 11 and a plurality of chip bonding plating layers to form a plurality of chip bonding conductor layers 13 are formed on the seed layer by frame plating, for example. Next, a plurality of second plating layers are formed on the plurality of first plating layers by frame plating, for example. Next, using the chip bonding plating layers and the layered film made up of the first and second plating layers as masks, the seed layer except portions located below the first plating layers and the chip bonding plating layers is removed by etching. As a result, the external connecting terminals 11 are formed of the first and second plating layers and portions of the seed layer remaining below the first plating layers, while the chip bonding conductor layers 13 are formed of the chip bonding plating layers and portions of the seed layer remaining therebelow.

The wafer 101 can also be fabricated by bonding a lead frame including the plurality of sets of the external connecting terminals 11 and the plurality of chip bonding conductor layers 13 onto the top surface 112a of the wafer main body 112. In this case, the lead frame is fabricated through a typical fabrication method. For example, the lead frame may be fabricated by stamping a sheet metal through the use of a die, or may be fabricated by patterning a sheet metal by etching.

The wafer 101 can also be fabricated by forming the plurality of sets of the external connecting terminals 11 and the plurality of chip bonding conductor layers 13 on the top surface 112a of the wafer main body 112 by sputtering. In this case, the external connecting terminals 11 and the chip bonding conductor layers 13 can be made of any of Mo, Cr, W, Pt, Pa and Ru or an alloy containing any of these.

The wafer 101 can also be fabricated by a method that will now be described. In this method, first, a ceramic plate is processed to fabricate the wafer main body 112 having a groove in which the plurality of sets of the external connecting terminals 11 and the plurality of chip bonding conductor layers 13 are to be placed. Next, the groove of the wafer main body 112 is filled with a conductive material to thereby form the plurality of sets of the external connecting terminals 11 and the plurality of chip bonding conductor layers 13. To fill the groove with a conductive material, a technique of melting a metal and pouring it into the groove, that is, casting, can be employed. In this case, the metal is preferably one that melts at low temperatures.

Although it is not necessarily required to provide the chip bonding conductor layers 13, it is preferred to provide them because of the following reasons. First, if the chip bonding conductor layers 13 are not provided, the chips 3 are to be directly bonded to the wafer main body 112 made of a resin or ceramic, for example. In this case, it is impossible to bond the chips 3 to the wafer main body 112 through the use of solder. In contrast, if the chip bonding conductor layers 13 are provided, it is easy to bond the chips 3 to the chip bonding conductor layers 13 through the use of solder. Furthermore, if the chip bonding conductor layers 13 are provided, it is possible to connect the chips 3 to the ground by using the chip bonding conductor layers 13 as the ground. This provides advantages such as a reduction in noise generated in the chips 3.

Figure 7:
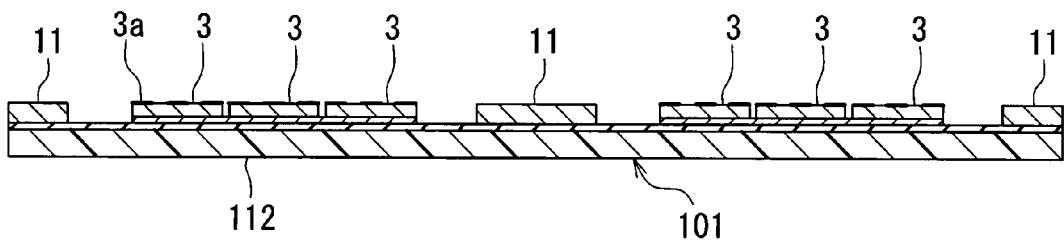
FIG. 7 is a cross-sectional view illustrating part of a stack of layers obtained in a step that follows the step illustrated in FIG. 6.

FIG. 7 and FIG. 18 illustrate the next step. FIG. 7 is a cross-sectional view of part of a stack of layers fabricated through this step. FIG. 18 is a top view of part of the stack of layers fabricated through this step. In this step, at least one chip 3 is bonded to each of the chip bonding conductor layers 13 of the pre-base portions 110. FIG. 7 and FIG. 18 illustrate an example in which nine chips 3 are bonded to each of the chip bonding conductor layers 13. As illustrated in FIG. 7, each of the chips 3 has a top surface, a bottom surface, and a plurality of electrodes 3a disposed on the top surface. The chips 3 are disposed such that their bottom surfaces are bonded to the chip bonding conductor layers 13. The top surfaces of the electrodes 3a are located at the same height or nearly the same height as the top surfaces of the external connecting terminals 11. In FIG. 8 to FIG. 19, illustration of the electrodes 3a is omitted.

Figure 8:
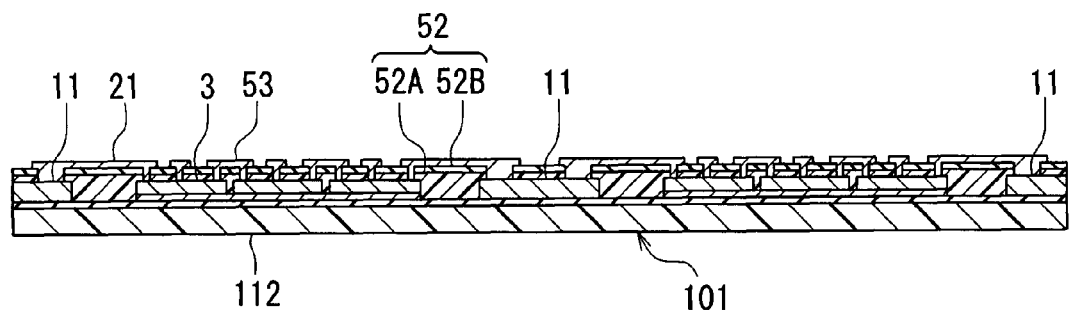
FIG. 8 is a cross-sectional view illustrating part of a stack of layers obtained in a step that follows the step illustrated in FIG. 7.

FIG. 8 and FIG. 19 illustrate the next step. FIG. 8 is a cross-sectional view of part of a stack of layers fabricated through this step. FIG. 19 is a top view of part of the stack of layers fabricated through this step. In this step, first formed is an insulating layer 52 that covers the plurality of chips 3 shown in FIG. 7 and that has a flattened top surface. The insulating layer 52 may include a resin insulating film 52A that covers the plurality of chips 3, and an inorganic insulating film 52B that covers the resin insulating film 52A and that has a flattened top surface. In this case, the resin insulating film 52A for covering the plurality of chips 3 is first formed, and then the inorganic insulating film 52B is formed to cover the resin insulating film 52A. The top surface of the resin insulating film 52A is flattened. The resin insulating film 52A is formed by, for example, applying a polyimide resin onto the stack of layers of FIG. 7, flattening the top surface and then hardening the polyimide resin. The inorganic insulating film 52B is formed by, for example, forming a film of $Al_2O_3$ or $SiO_2$ into a thickness of 2 to 10 μm, for example, on the resin insulating film 52A by sputtering, and then flattening the top surface of this film by polishing through chemical mechanical polishing (hereinafter referred to as CMP), for example. The thickness of the inorganic insulating film 52B after the polishing is within a range of 0.5 to 1 μm, for example. Next, the insulating layer 52 is selectively etched to thereby form in the insulating layer 52 a plurality of openings for exposing portions of the top surfaces of the external connecting terminals 11 and the top surfaces of the chips 3a.

Next, a plurality of terminal connecting portions 21 and a plurality of inter-chip connecting portions 53 corresponding to the plurality of electronic component packages 1 are formed at the same time. The terminal connecting portions 21 and the inter-chip connecting portions 53 each include a portion disposed on the insulating layer 52 and portions inserted to the openings of the insulating layer 52. The terminal connecting portions 21 and the inter-chip connecting portions 53 are formed by frame plating, for example. In this case, first, a seed layer for plating is formed on the top surface and in the openings of the insulating layer 52. Next, a frame for plating is formed on the seed layer by photolithography.

The frame has openings formed in regions where the terminal connecting portions 21 and the inter-chip connecting portions 53 are to be formed. Next, a plating layer is formed in the openings of the frame. Next, the frame is removed. Next, the seed layer except portions located below the plating layer is removed by etching. The etching of the seed layer is performed by ion beam etching or wet etching, for example. In the case where the seed layer is etched by ion beam etching, it is preferred that the insulating layer 52 include the resin insulating film 52A and the inorganic insulating film 52B. That is, by the presence of the inorganic insulating film 52B on the resin insulating film 52A, it is possible to prevent the resin insulating film 52A from being etched when the seed layer is etched by ion beam etching. In the case of where the seed layer is etched by wet etching, the insulating layer 52 may be composed of the resin insulating film 52A only. In the case where the seed layer is etched by wet etching, it is possible to reduce damage to the chips 3 as compared with the case where the seed layer is etched by ion beam etching.

When the terminal connecting portions 21 and the inter-chip connecting portions 53 are formed, a connecting portion for connecting different ones of the electrodes of each chip 3 to each other, or a connecting portion for connecting different ones of the external connecting terminals 11 to each other may be formed at the same time.

Figure 9:
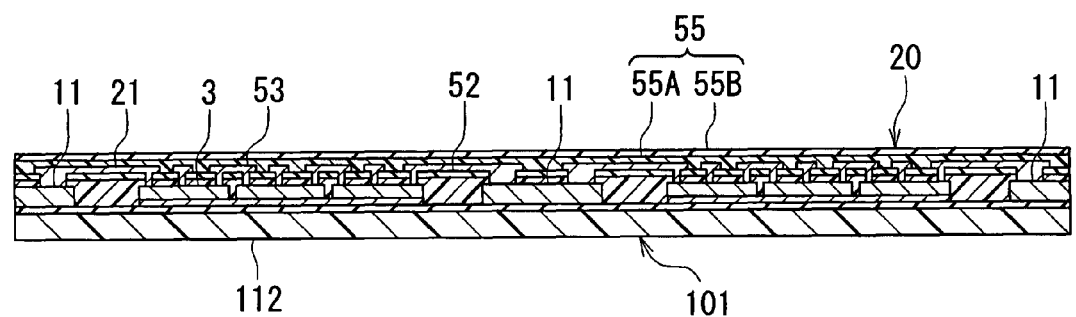
FIG. 9 is a cross-sectional view illustrating part of a stack of layers obtained in a step that follows the step illustrated in FIG. 8.

FIG. 9 illustrates the next step. In this step, a flattened layer 55 of the layer portion 20 is formed to cover the entire top surface of the stack of layers shown in FIG. 8. This flattened layer 55 may include a resin insulating film 55A, and an inorganic insulating film 55B that covers the resin insulating film 55A and that has a flattened top surface. In this case, the resin insulating film 55A for covering the entire top surface of the stack of layers of FIG. 8 is first formed, and then the inorganic insulating film 55B is formed to cover the resin insulating film 55A. The top surface of the resin insulating film 55A is flattened. The resin insulating film 55A is formed by, for example, applying a polyimide resin onto the stack of layers of FIG. 8, flattening the top surface and then hardening the polyimide resin. The inorganic insulating film 55B is formed by, for example, forming a film of $Al_2O_3$ or $SiO_2$ into a thickness of 2 to 10 μm, for example, on the resin insulating film 55A by sputtering, and then flattening the top surface of this film by polishing through CMP, for example. The thickness of the inorganic insulating film 55B after the polishing is within a range of 0.5 to 1 μm, for example.

The top surface of the flattened layer 55 touches the layer portion 30 that will be disposed thereon later. To dispose the plurality of chips 3 of the layer portion 30 with precision, it is preferred that the top surface of the flattened layer 55 have high flatness. To increase the flatness of the top surface of the flattened layer 55, it is preferred that the flattened layer 55 include the resin insulating film 55A and the inorganic insulating film 55B.

In the case where the layer portion 30 includes the chip bonding conductor layer 33, it is also preferred that the flattened layer 55 include the resin insulating film 55A and the inorganic insulating film 55B. Compared with the resin insulating film 55A, the inorganic insulating film 55B has a higher adhesiveness to a meal layer. Therefore, by the presence of the inorganic insulating film 55B on the resin insulating film 55A, it is possible to attain a higher adhesiveness between the top surface of the flattened layer 55 and the chip bonding conductor layer 33 as compared with a case where the inorganic insulating film 55B is not present.

The flattened layer 55 may be composed of the inorganic insulating film 55B only. Through the steps described so far, a plurality of layer portions 20 corresponding to the plurality of electronic component packages 1 are formed on the wafer 101.

Figure 10:
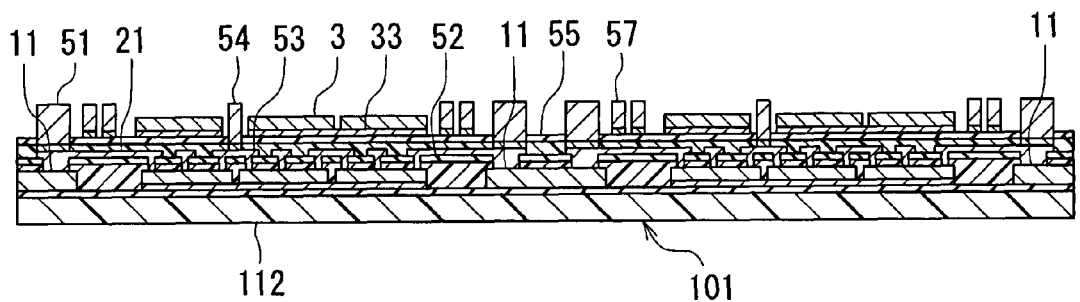
FIG. 10 is a cross-sectional view illustrating part of a stack of layers obtained in a step that follows the step illustrated in FIG. 9.

FIG. 10 illustrates the next step. In this step, first, a plurality of chip bonding conductor layers 33 corresponding to the plurality of electronic component packages 1 are formed on the top surfaces of the flattened layers 55 of the layer portions 20. The material, thickness and forming method of the chip bonding conductor layers 33 are the same as those of the chip bonding conductor layers 13. Next, at least one chip 3 is bonded to each of the chip bonding conductor layers 33.

Next, by selectively etching the flattened layers 55, a plurality of openings to which columnar conductors 51 and 54 will be inserted later are formed in the flattened layers 55. Next, a plurality of columnar conductors 51 and 54 corresponding to the plurality of electronic component packages 1 are formed at the same time by frame plating, for example. The conductors 51 and 54 are inserted to the openings of the flattened layers 55. The lower ends of the columnar conductors 51 are connected to conductor layers that are connected to the external connecting terminals 11 in the layer portions 20, that is, the terminal connecting portions 21, for example. The lower ends of the columnar conductors 54 are connected to conductor layers that are connected to the electrodes 3a of the chips 3 in the layer portions 20, that is, the inter-chip connecting portions 53, for example.

The columnar conductors 51 and 54 are formed such that their top surfaces are located higher than the top surfaces of the electrodes 3a of the chips 3 included in the layer portions 30. When the columnar conductors 51 and 54 are formed, conductor layers 57 for wiring in the layer portions 30 may be formed on the flattened layers 55 at the same time.

Figure 11:
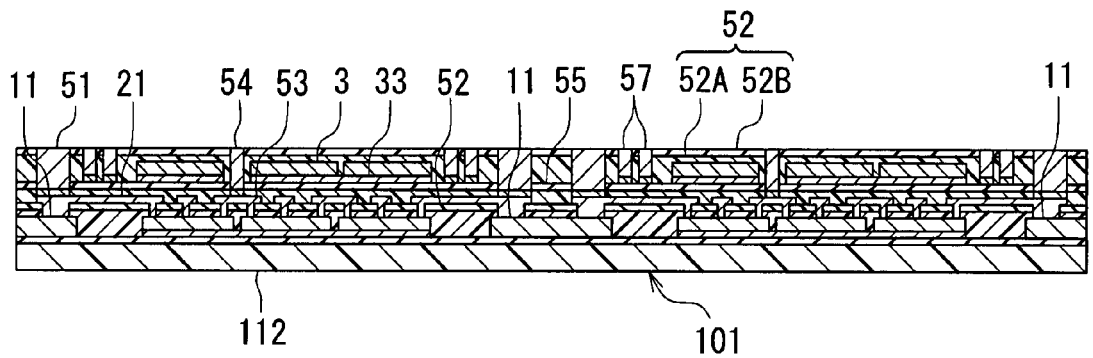
FIG. 11 is a cross-sectional view illustrating part of a stack of layers obtained in a step that follows the step illustrated in FIG. 10.

FIG. 11 illustrates the next step. In this step, an insulating layer 52 of the layer portion 30 is formed. The insulating layer 52 covers a plurality of chips 3 included in the layer portion 30 and has a flattened top surface. The insulating layer 52 may include a resin insulating film 52A that covers the plurality of chips 3, and an inorganic insulating film 52B that covers the resin insulating film 52A and that has a flattened top surface. The material, thickness and forming method of the resin insulating film 52A and the inorganic insulating film 52B of the layer portion 30 are the same as those of the resin insulating film 52A and the inorganic insulating film 52B of the layer portion 20. In this step, when the inorganic insulating film 52B is polished by a method such as CMP to flatten the top surface of the film 52B, the polishing is performed such that the top surfaces of the columnar conductors 51 and 54 are exposed and the top surfaces of the conductors 51 and 54 and the film 52B are flattened. As is the case of the insulating layer 52 of the layer portion 20, the insulating layer 52 of the layer portion 30 may be composed of the resin insulating film 52A only.

Figure 12:
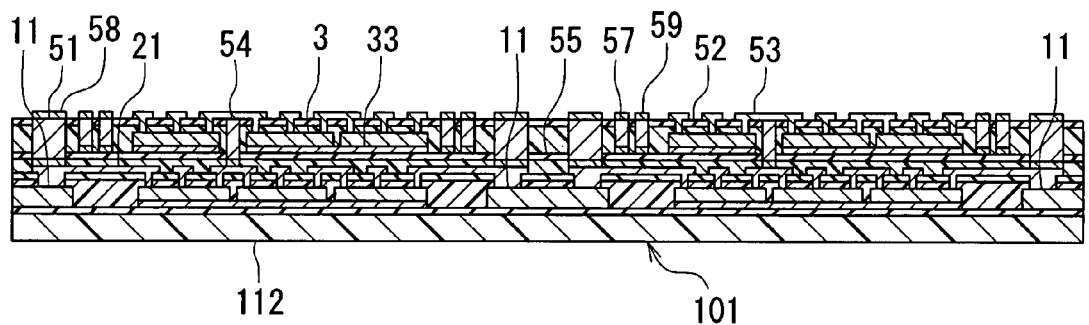
FIG. 12 is a cross-sectional view illustrating part of a stack of layers obtained in a step that follows the step illustrated in FIG. 11.

FIG. 12 illustrates the next step. In this step, first, by selectively etching the insulating layer 52 of the layer portion 30, a plurality of openings are formed in the insulating layer 52 for exposing the top surfaces of the electrodes 3a of the plurality of chips 3 included in the layer portion 30.

Next, a plurality of inter-chip connecting portions 53 corresponding to the plurality of electronic component packages 1 are formed. The method of forming these inter-chip connecting portions 53 is the same as the method of forming the inter-chip connecting portions 53 of the layer portions 20. When the inter-chip connecting portions 53 are formed, conductor layers 58 to be connected to the top surfaces of the columnar conductors 51 and conductor layers 59 to be connected to the top surfaces of the conductor layers 57 may be formed at the same time. The conductor layers 58 and 59 may be connected to the electrodes 3a of the chips 3 included in the layer portion 30. A terminal connecting line for electrically connecting the electrodes 3a of the chips 3 included in the layer portion 30 to the external connecting terminals 11 is composed of, for example, the conductor layer 58 and the columnar conductor 51 of the layer portion 30 and the terminal connecting portion 21 of the layer portion 20. In this step, there are formed a plurality of terminal connecting lines corresponding to the plurality of electronic component packages 1.

Conductor layers connected to the electrodes 3a of the chips 3 in the layer portion 30, that is, the inter-chip connecting portions 53 for example, are connected to the top surfaces of the columnar conductors 54. An inter-chip connecting line for connecting the electrodes 3a of the chips 3 included in the layer portion 30 to the electrodes 3a of the chips 3 included in the layer portion 20 is composed of, for example, the inter-chip connecting portion 53 and the columnar conductor 54 of the layer portion 30 and the inter-chip connecting portion 53 of the layer portion 20. In this step, there are formed a plurality of inter-chip connecting lines corresponding to the plurality of electronic component packages 1.

Figure 13:
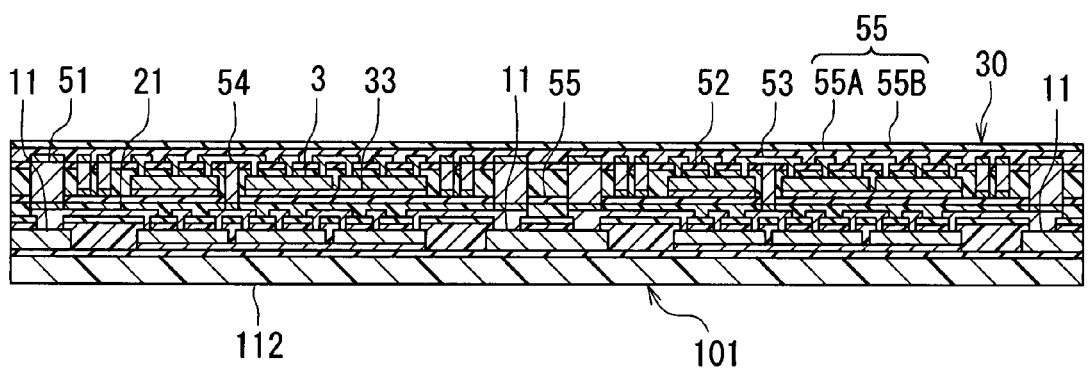
FIG. 13 is a cross-sectional view illustrating part of a stack of layers obtained in a step that follows the step illustrated in FIG. 12.

FIG. 13 illustrates the next step. In this step, a flattened layer 55 of the layer portion 30 is formed to cover the entire top surface of the stack of layers shown in FIG. 12. The flattened layer 55 may include a resin insulating film 55A, and an inorganic insulating film 55B that covers the resin insulating film 55A and that has a flattened top surface. The material, thickness and forming method of the resin insulating film 55A and the inorganic insulating film 55B of the layer portion 30 are the same as those of the resin insulating film 55A and the inorganic insulating film 55B of the layer portion 20.

The flattened layer 55 may be composed of the inorganic insulating film 55B only. Through the steps described so far, a plurality of layer portions 30 corresponding to the plurality of electronic component packages 1 are formed on the plurality of layer portions 20 corresponding to the plurality of electronic component packages 1.

Figure 14:
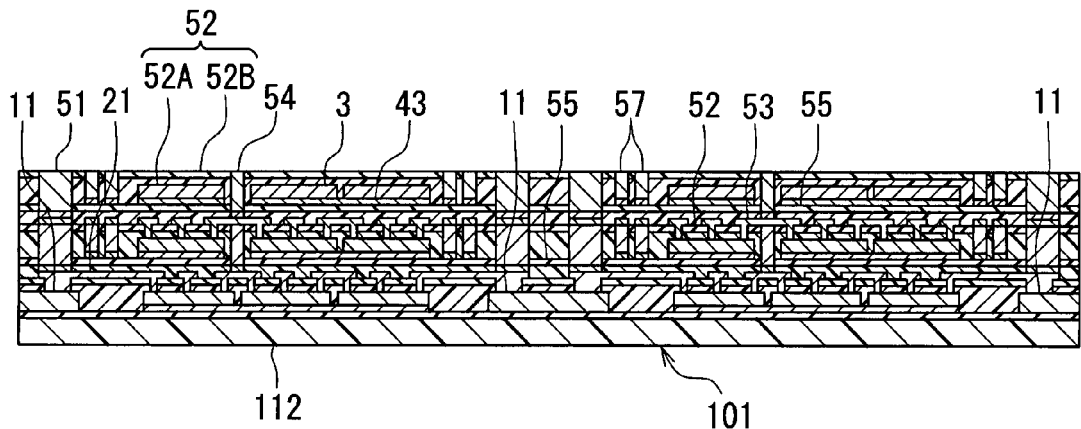
FIG. 14 is a cross-sectional view illustrating part of a stack of layers obtained in a step that follows the step illustrated in FIG. 13.

FIG. 14 illustrates the next step. In this step, first, a plurality of chip bonding conductor layers 43 corresponding to the plurality of electronic component packages 1 are formed on the top surfaces of the flattened layers 55 of the layer portions 30. The material, thickness and forming method of the chip bonding conductor layers 43 are the same as those of the chip bonding conductor layers 13. Next, at least one chip 3 is bonded to each of the chip bonding conductor layers 43.

Next, by selectively etching the flattened layers 55 of the layer portions 30, a plurality of openings to which columnar conductors 51 and 54 will be inserted later are formed in the flattened layers 55. Next, a plurality of columnar conductors 51 and 54 corresponding to the plurality of electronic component packages 1 are formed at the same time by frame plating, for example. The columnar conductors 51 and 54 are inserted to the openings of the flattened layers 55. The lower ends of the columnar conductors 51 are connected to the columnar conductors 51 of the layer portions 30, for example. The lower ends of the columnar conductors 54 are connected to conductor layers that are connected to the electrodes 3a of the chips 3 in the layer portions 30, that is, the inter-chip connecting portions 53, for example.

The columnar conductors 51 and 54 are formed such that their top surfaces are located higher than the top surfaces of the electrodes 3a of the chips 3 included in the layer portions 40. When the conductors 51 and 54 are formed, conductor layers 57 for wiring in the layer portions 40 may be formed on the flattened layers 55 at the same time.

Next, an insulating layer 52 of the layer portion 40 is formed. The insulating layer 52 covers a plurality of chips 3 included in the layer portion 40 and has a flattened top surface. The insulating layer 52 may include a resin insulating film 52A that covers the plurality of chips 3, and an inorganic insulating film 52B that covers the resin insulating film 52A and that has a flattened top surface. The material, thickness and forming method of the resin insulating film 52A and the inorganic insulating film 52B of the layer portion 40 are the same as those of the resin insulating film 52A and the inorganic insulating film 52B of the layer portion 20. In this step, when the inorganic insulating film 52B is polished by a method such as CMP to flatten the top surface of the film 52B, the polishing is performed such that the top surfaces of the columnar conductors 51 and 54 are exposed and the top surfaces of the conductors 51 and 54 and the film 52B are flattened. As is the case of the insulating layer 52 of the layer portion 20, the insulating layer 52 of the layer portion 40 may be composed of the resin insulating film 52A only.

Figure 15:
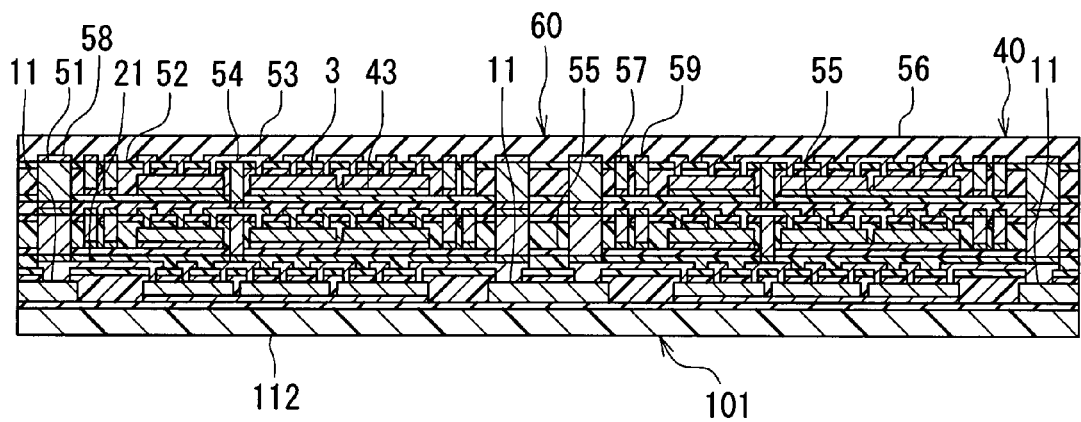
FIG. 15 is a cross-sectional view illustrating part of a stack of layers obtained in a step that follows the step illustrated in FIG. 14.

FIG. 15 illustrates the next step. In this step, first, by selectively etching the insulating layer 52 of the layer portion 40, a plurality of openings are formed in the insulating layer 52 for exposing the top surfaces of the electrodes 3a of the plurality of chips 3 included in the layer portion 40.

Next, a plurality of inter-chip connecting portions 53 corresponding to the plurality of electronic component packages 1 are formed. The method of forming these inter-chip connecting portions 53 is the same as the method of forming the inter-chip connecting portions 53 of the layer portion 20. When the inter-chip connecting portions 53 are formed, conductor layers 58 to be connected to the top surfaces of the columnar conductors 51 and conductor layers 59 to be connected to the top surfaces of the conductor layers 57 may be formed at the same time. The conductor layers 58 and 59 may be connected to the electrodes 3a of the chips 3 included in the layer portion 40. A terminal connecting line for electrically connecting the electrodes 3a of the chips 3 included in the layer portion 40 to the external connecting terminals 11 is composed of, for example, the conductor layer 58 and the columnar conductor 51 of the layer portion 40, the conductor layer 58 and the columnar conductor 51 of the layer portion 30 and the terminal connecting portion 21 of the layer portion 20. In this step, there are formed a plurality of terminal connecting lines corresponding to the plurality of electronic component packages 1.

Conductor layers connected to the electrodes 3a of the chips 3 in the layer portion 40, that is, the inter-chip connecting portions 53 for example, are connected to the top surfaces of the columnar conductors 54. An inter-chip connecting line for connecting the electrodes 3a of the chips 3 included in the layer portion 40 to the electrodes 3a of the chips 3 included in the layer portion 30 is composed of, for example, the inter-chip connecting portion 53 and the columnar conductor 54 of the layer portion 40 and the inter-chip connecting portion 53 of the layer portion 30. Furthermore, an inter-chip connecting line for connecting the electrodes 3a of the chips 3 included in the layer portion 40 to the electrodes 3a of the chips 3 included in the layer portion 20 is composed of, for example, the inter-chip connecting portion 53 and the columnar conductor 54 of the layer portion 40, the inter-chip connecting portion 53 and the columnar conductor 54 of the layer portion 30 and the inter-chip connecting portion 53 of the layer portion 20. In this step, there are formed a plurality of inter-chip connecting lines corresponding to the plurality of electronic component packages 1.

FIG. 15 illustrates the next step. In this step, the protection layer 56 is formed to cover the entire top surface of the stack of layers shown in FIG. 14. The protection layer 56 is made of, for example, PSG (phospho-silicate glass), $SiO_2$, a polyimide resin, or $Al_2O_3$. The protection layer 56 has a thickness within a range of 1 to 5 μm, for example. Through the steps described so far, a plurality of layer portions 40 corresponding to the plurality of electronic component packages 1 are formed on the plurality of layer portions 30 corresponding to the plurality of electronic component packages 1, and the substructure 60 of the embodiment is thereby completed.

The substructure 60 includes: the wafer 101 including the plurality of pre-base portions 110 (see FIG. 2 and FIG. 3); and the plurality of sets of the layer portions 20, 30 and 40 that are disposed on the wafer 101 such that the layer portions 20, 30 and 40 are disposed on each of the pre-base portions 110 of the wafer 101.

Figure 16:
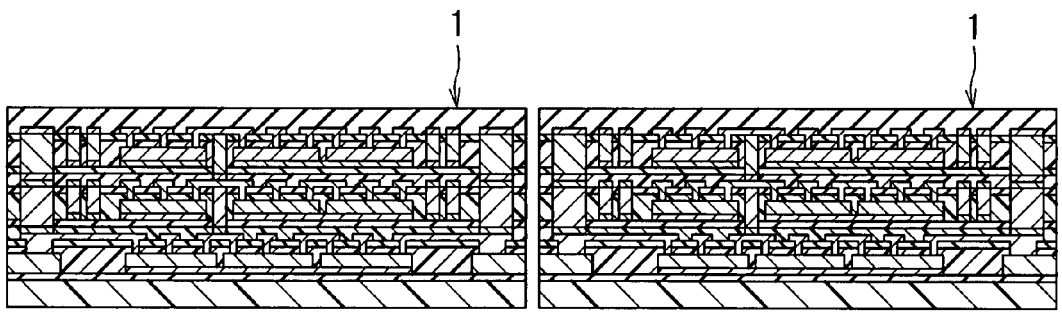
FIG. 16 is a cross-sectional view illustrating electronic component packages fabricated in a step that follows the step illustrated in FIG. 15.

FIG. 16 illustrates the next step. In this step, the substructure 60 is cut so that portions including the respective pre-base portions 110 and the layer portions 20, 30 and 40 disposed thereon are separated from one another to form the plurality of electronic component packages 1. The plurality of electronic component packages 1 are thereby manufactured at the same time.

Figure 21:
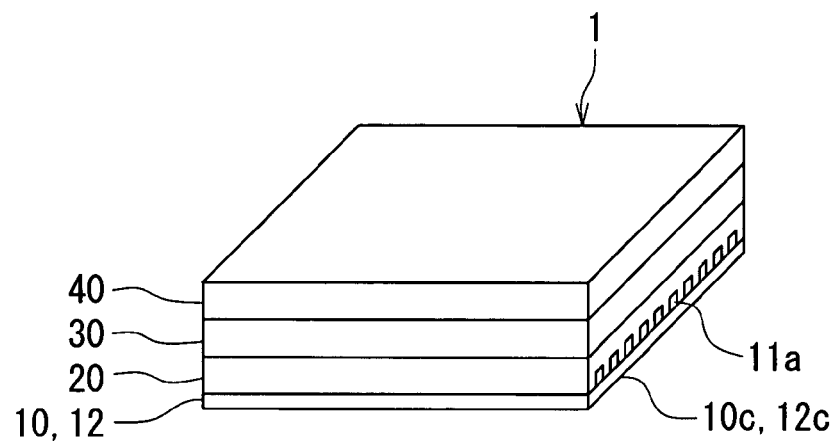
FIG. 21 is a perspective view of the electronic component package of the embodiment of the invention.

FIG. 21 is a perspective view illustrating an appearance of the electronic component package 1. As shown in FIG. 21, the electronic component package 1 is rectangular-solid-shaped, for example. In this case, the base 10 has four side surfaces 10c. In at least one such as two of the side surfaces 10c, the end faces 11a of the plurality of external connecting terminals 11 are exposed.

Figure 22:
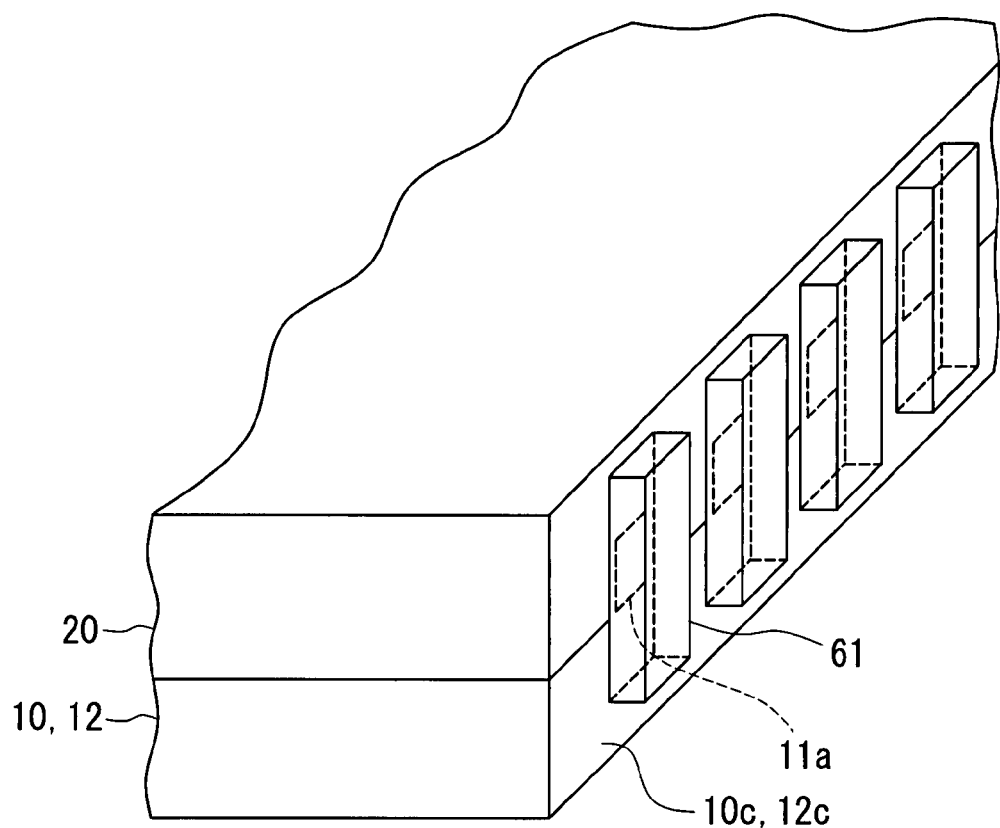
FIG. 22 is a perspective view of part of the electronic component package of the embodiment of the invention.

FIG. 22 illustrates part of the electronic component package 1 on a magnified scale. As shown in FIG. 22, the electronic component package 1 may further include a plurality of terminal conductor films 61 disposed on the side surfaces 10c of the base 10 and respectively connected to the end faces 11a of the external connecting terminals 11. In this case, the method of manufacturing the electronic component package 1 further includes the step of forming the plurality of terminal conductor films 61 after the step of cutting the substructure 60. In this case, it is preferred to polish, before forming the conductor films 61, the surfaces on which the conductor films 61 are to be disposed. The conductor films 61 are made of Au, for example. The conductor films 61 are formed by plating, for example.

Figure 23:
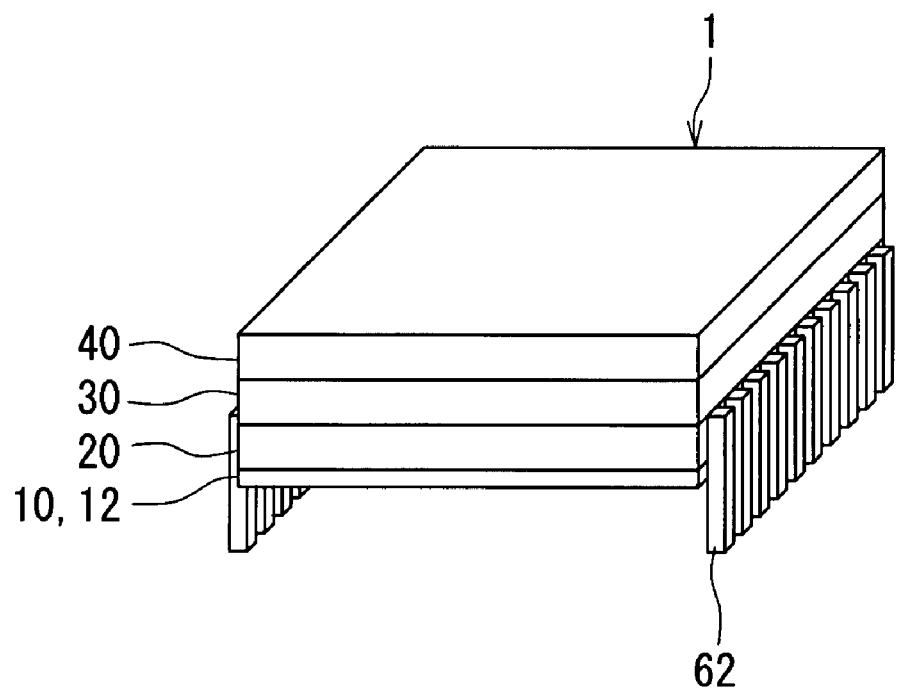
FIG. 23 is a perspective view illustrating another configuration of the electronic component package of the embodiment of the invention.

FIG. 23 is a perspective view illustrating another configuration of the electronic component package 1. Although the electronic component package 1 may have the configuration shown in FIG. 21 or FIG. 22, the package 1 may further include, as shown in FIG. 23, a plurality of terminal pins 62 respectively connected to the end faces 11a of the external connecting terminals 11. In this case, the method of manufacturing the electronic component package 1 further includes the step of connecting the terminal pins 62 to the end faces 11a of the external connecting terminals 11 after the step of cutting the substructure 60.

Figure 24:
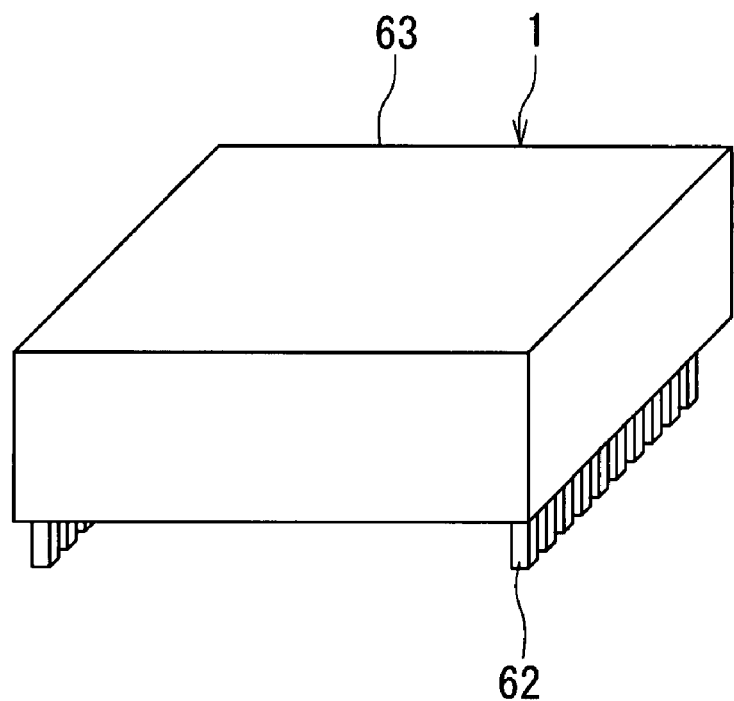
FIG. 24 is a perspective view illustrating still another configuration of the electronic component package of the embodiment of the invention.

FIG. 24 is a perspective view illustrating still another configuration of the electronic component package 1. In addition to the configuration show in FIG. 23, the electronic component package 1 of FIG. 24 further includes a protection layer 63 that covers the connecting portions between the external connecting terminals 11 and the terminal pins 62. The protection layer 63 is made of a resin, for example. The protection layer 63 reinforces the connecting portions between the external connecting terminals 11 and the terminal pins 62.

As has been described, according to the method of manufacturing the electronic component package 1 of the embodiment, the wafer 101 is first fabricated. The wafer 101 incorporates: a plurality of sets of the external connecting terminals 11 corresponding to a plurality of electronic component packages 1; and the wafer main body 112 for retaining the plurality of sets of the external connecting terminals 11. The wafer 101 includes a plurality of pre-base portions 110 that will be separated from one another later to thereby become the bases 10 of the respective electronic component packages 1. Then, according to the embodiment, a plurality of sets of the layer portions 20, 30 and 40 are formed on the wafer 101 such that a plurality of layer portions 20, 30 and 40 are disposed on each of the pre-base portions 110 of the wafer 101, to thereby fabricate the substructure 60 including the wafer 101 and the plurality of sets of the layer portions 20, 30 and 40. Each of the layer portions 20, 30 and 40 includes at least one chip 3. Next, the substructure 60 is cut so that portions including the respective pre-base portions 110 and the layer portions 20, 30 and 40 disposed thereon are separated from one another to thereby form the plurality of electronic component packages 1. Thus, according to the embodiment, it is possible to mass-produce the electronic component package 1 at low cost in a short period of time, the package 1 incorporating the plurality of layer portions 20, 30 and 40 and thereby allowing higher integration.

The wafer 101 of the embodiment includes no circuit element. As a result, even if any alteration is required for the specifications of the electronic component packages 1, it is not totally required to make any alteration to the wafer 101, or even if a change in the number and/or arrangement of the external connecting terminals 11 is required, it is easy to make such a change. According to the embodiment, it is easy to alter the specifications of the electronic component packages 1 by modifying the chips 3 to be disposed in the respective pre-base portions 110 of the wafer 101. Because of these features of the embodiment, it is possible to respond to alterations to the specifications of the electronic component packages 1 flexibly and quickly.

According to the embodiment, by connecting the plurality of chips 3 to each other through the inter-chip connecting portion 53 or the inter-chip connecting line, it is possible to mass-produce the electronic component packages 1 as multi-chip modules at low cost in a short period of time.

Furthermore, according to the embodiment, a plurality of sets of the external connecting terminals 11 corresponding to a plurality of electronic component packages 1 are provided in advance on the wafer 101. Therefore, the embodiment does not require a step of forming external connecting terminals after cutting the wafer, for example. It is thus possible to reduce the number of steps for manufacturing the electronic component package 1.

In the embodiment, it is possible to employ any combination of the plurality of chips 3 included in the electronic component package 1. Examples of combination of the plurality of chips 3 include a combination of two or more circuit elements of the same type or different types selected from C-MOS integrated circuit elements, high-speed C-MOS integrated circuit elements, high-withstand C-MOS integrated circuit elements, bipolar integrated circuit elements, high-speed bipolar integrated circuit elements, and high-withstand bipolar integrated circuit elements. Furthermore, a plurality of memory elements such as flash memory, SRAM, DRAM or PROM may be provided as the plurality of chips 3. It is thereby possible to manufacture the electronic component package 1 functioning as a memory element having a large storage capacity. Furthermore, a sensor or an actuator formed by using the MEMS and a driver circuit element for driving it may be provided in the electronic component package 1.

According to the embodiment, in the layer portion 20, the top surface of each of the external connecting terminals 11 is located at the same height or nearly the same height as the top surface of each of the electrodes 3a of the chips 3. As a result, it is possible to easily connect the chips 3 to the external connecting terminals 11 through the terminal connecting portions 21, and to form the terminal connecting portions 21 with accuracy.

The present invention is not limited to the foregoing embodiment but may be practiced in still other ways. For example, the terminal connecting portions 21 and the terminal connecting lines may connect a plurality of electrodes 3a of the chips 3 to one or more external connecting terminals 11, or may connect one or more electrodes 3a of the chips 3 to a plurality of external connecting terminals 11. The inter-chip connecting portions 53 and the inter-chip connecting lines may connect three or more electrodes 3a of a plurality of chips 3 to one another.

The foregoing embodiment illustrates an example in which the plurality of external connecting terminals 11 are arranged such that the end faces 11a of the external connecting terminals 11 are exposed at two of the four side surfaces 10c of the base 10. In the present invention, however, it is possible that the plurality of external connecting terminals 11 are arranged such that the end faces 11a of the external connecting terminals 11 are exposed at one, three or four of the four side surfaces 10c of the base 10.

It is apparent that the present invention can be carried out in various forms and modifications in the light of the foregoing descriptions. Accordingly, within the scope of the following claims and equivalents thereof, the present invention can be carried out in forms other than the foregoing most preferred embodiment.

What is claimed is:

1. An electronic component package substructure used for manufacturing a plurality of electronic component packages, each of the electronic component packages comprising: a base having a top surface and a side surface; and a plurality of layer portions stacked on the top surface of the base wherein: the base includes a plurality of external connecting terminals and a retainer for retaining the plurality of external connecting terminals; each of the external connecting terminals has an end face located at the side surface of the base; each of the electronic component packages has a top surface and a bottom surface that are opposite to each other, the bottom surface corresponding to a bottom surface of the base; and, of terminals or electrodes that are electrically connected to any of the plurality of external connecting terminals, none are exposed in either the top surface or the bottom surface of each of the electronic component packages, the electronic component package substructure comprising:
a wafer that incorporates a plurality of sets of the external connecting terminals corresponding to the plurality of electronic component packages and a wafer main body for retaining the plurality of sets of the external connecting terminals, the wafer including a plurality of pre-base portions configured to be separated from one another later so that each of them will thereby become the base; and
a plurality of sets of the layer portions of the plurality of layer portions the disposed on the wafer such that the layer portions of each set of the plurality of sets of the layer portions are stacked on a corresponding one of the plurality of pre-base portions of the wafer, wherein:
each of the plurality of layer portions includes at least one electronic component chip;
at least one of a plurality of electronic component chips that the plurality of layer portions include is electrically connected to at least one of the external connecting terminals; and
the wafer has a bottom surface corresponding to the bottom surface of the base, and none of the plurality of sets of the external connecting terminals are exposed in the bottom surface of the wafer.

2. The electronic component package substructure according to claim 1, wherein the wafer further incorporates a plurality of chip bonding conductor layers to each of which the at least one electronic component chip included in one of the layer portions that is closest to the base is to be bonded.

3. The electronic component package substructure according to claim 1, wherein:
each of the electronic component chips has a plurality of electrodes, and one of the layer portions that is closest to the base further includes at least one terminal connecting portion for electrically connecting at least one of the electrodes of the electronic component chip included therein to at least one of the external connecting terminals; and
the plurality of sets of the layer portions of the electronic component package substructure include a plurality of terminal connecting portions corresponding to the plurality of electronic component packages.

4. The electronic component package substructure according to claim 1, wherein:
each of the electronic component chips has a plurality of electrodes, and the electronic component package includes at least one terminal connecting line for electrically connecting at least one of the electrodes of the electronic component chips included in the plurality of layer portions except the one closest to the base to at least one of the external connecting terminals; and
the plurality of sets of the layer portions of the electronic component package substructure include a plurality of terminal connecting lines corresponding to the plurality of electronic component packages.

5. The electronic component package substructure according to claim 4, wherein each of the terminal connecting lines includes a columnar conductor that penetrates at least one of the layer portions.

6. The electronic component package substructure according to claim 1, wherein:
each of the electronic component chips has a plurality of electrodes, and at least one of the layer portions includes: a plurality of electronic component chips; and at least one inter-chip connecting portion for electrically connecting the electrodes of the plurality of electronic component chips to each other; and
the plurality of sets of the layer portions of the electronic component package substructure include a plurality of inter-chip connecting portions corresponding to the plurality of electronic component packages.

7. The electronic component package substructure according to claim 6, wherein:
the at least one of the layer portions that includes the plurality of electronic component chips further includes an insulating layer that covers the plurality of electronic component chips and that has a flattened top surface;
the insulating layer has an opening for exposing the electrodes that are connected to each other through the at least one inter-chip connecting portion; and
the at least one inter-chip connecting portion includes a portion disposed on the insulating layer and a portion inserted to the opening.

8. The electronic component package substructure according to claim 7, wherein the insulating layer includes: a resin insulating film that covers the plurality of electronic component chips; and an inorganic insulating film that covers the resin insulating film and that has a flattened top surface.

9. The electronic component package substructure according to claim 1, wherein:
each of the electronic component chips has a plurality of electrodes, and the electronic component package includes at least one inter-chip connecting line for connecting the electrodes of two of the electronic component chips included in different ones of the layer portions to each other; and
the plurality of sets of the layer portions of the electronic component package substructure include a plurality of inter-chip connecting lines corresponding to the plurality of electronic component packages.

10. The electronic component package substructure according to claim 9, wherein each of the inter-chip connecting lines includes a columnar conductor that penetrates at least one of the layer portions.

11. The electronic component package substructure according to claim 1, wherein the plurality of layer portions except the one farthest from the base include a flattened layer having a top surface that is flattened and that touches one of the layer portions disposed thereon.

12. The electronic component package substructure according to claim 11, wherein the flattened layer includes: a resin insulating film; and an inorganic insulating film that covers the resin insulating film and that has a flattened top surface.

13. The electronic component package substructure according to claim 11, wherein one of the layer portions that is farthest from the base further includes a protection layer that covers the at least one electronic component chip included therein.

14. A method of manufacturing a plurality of electronic component packages, each of the electronic component packages comprising: a base having a top surface and a side surface; and a plurality of layer portions stacked on the top surface of the base, wherein: the base includes a plurality of external connecting terminals and a retainer for retaining the plurality of external connecting terminals; each of the external connecting terminals has an end face located at the side surface of the base; each of the electronic component packages has a top surface and a bottom surface that are opposite to each other, the bottom surface corresponding to a bottom surface of the base; and, of terminals or electrodes that are electrically connected to any of the plurality of external connecting terminals, none are exposed in either the top surface or the bottom surface of each of the electronic component packages,
the method comprising the steps of:
fabricating a wafer that incorporates a plurality of sets of the external connecting terminals corresponding to the plurality of electronic component packages and a wafer main body for retaining the plurality of sets of the external connecting terminals, the wafer including a plurality of pre-base portions configured to be separated from one another later so that each of them will thereby become the base;
fabricating an electronic component package substructure including the wafer and a plurality of sets of the layer portions of the plurality of layer portions by forming the plurality of sets of the layer portions on the wafer such that the layer portions of each set of the plurality of sets of layer portions are stacked on a corresponding one of the plurality of pre-base portions of the wafer; and
cutting the electronic component package substructure so that portions including the respective pre-base portions and the plurality of layer portions disposed thereon are separated from one another to thereby form the plurality of electronic component packages, wherein:
each of the plurality of layer portions includes at least one electronic component chip;
at least one of a plurality of electronic component chips that the plurality of layer portions include is electrically connected to at least one of the external connecting terminals; and
the wafer has a bottom surface corresponding to the bottom surface of the base, and none of the plurality of sets of the external connecting terminals are exposed in the bottom surface of the wafer.

15. The method according to claim 14, wherein the wafer further incorporates a plurality of chip bonding conductor layers to each of which the at least one electronic component chip included in one of the layer portions that is closest to the base is to be bonded.

16. The method according to claim 14, wherein:
each of the electronic component chips has a plurality of electrodes, and one of the layer portions that is closest to the base further includes at least one terminal connecting portion for electrically connecting at least one of the electrodes of the electronic component chip included therein to at least one of the external connecting terminals; and
the step of fabricating the electronic component package substructure includes the step of forming a plurality of terminal connecting portions corresponding to the plurality of electronic component packages.

17. The method according to claim 14, wherein:
each of the electronic component chips has a plurality of electrodes, and the electronic component package includes at least one terminal connecting line for electrically connecting at least one of the electrodes of the electronic component chips included in the plurality of layer portions except the one closest to the base to at least one of the external connecting terminals; and
the step of fabricating the electronic component package substructure includes the step of forming a plurality of terminal connecting lines corresponding to the plurality of electronic component packages.

18. The method according to claim 17, wherein:
each of the terminal connecting lines includes a columnar conductor that penetrates at least one of the layer portions; and
the step of forming the plurality of terminal connecting lines includes the steps of:
forming a plurality of columnar conductors corresponding to the plurality of electronic component packages;
forming an insulating layer so as to cover the plurality of columnar conductors; and
polishing the insulating layer so that the plurality of columnar conductors are exposed.

19. The method according to claim 14, wherein:
each of the electronic component chips has a plurality of electrodes, and at least one of the layer portions includes: a plurality of electronic component chips; and at least one inter-chip connecting portion for electrically connecting the electrodes of the plurality of electronic component chips to each other; and
the step of fabricating the electronic component package substructure includes the step of forming a plurality of inter-chip connecting portions corresponding to the plurality of electronic component packages.

20. The method according to claim 19, wherein:
the at least one of the layer portions that includes the plurality of electronic component chips further includes an insulating layer that covers the plurality of electronic component chips and that has a flattened top surface;
the insulating layer has an opening for exposing the electrodes that are connected to each other through the at least one inter-chip connecting portion;
the at least one inter-chip connecting portion includes a portion disposed on the insulating layer and a portion inserted to the opening; and
the step of fabricating the electronic component package substructure includes the step of forming the insulating layer before the plurality of inter-chip connecting portions are formed.

21. The method according to claim 20, wherein:
the insulating layer includes a resin insulating film that covers the plurality of electronic component chips, and an inorganic insulating film that covers the resin insulating film and that has a flattened top surface; and
the step of forming the insulating layer includes the steps of:
forming the resin insulating film;
forming the inorganic insulating film so as to cover the resin insulating film;
flattening the top surface of the inorganic insulating film; and
forming the opening in the resin insulating film and the inorganic insulating film.

22. The method according to claim 14, wherein:
each of the electronic component chips has a plurality of electrodes, and the electronic component package includes at least one inter-chip connecting line for connecting the electrodes of two of the electronic component chips included in different ones of the layer portions to each other; and
the step of fabricating the electronic component package substructure includes the step of forming a plurality of inter-chip connecting lines corresponding to the plurality of electronic component packages.

23. The method according to claim 22, wherein:
each of the inter-chip connecting lines includes a columnar conductor that penetrates at least one of the layer portions; and
the step of forming the plurality of inter-chip connecting lines includes the steps of:
forming a plurality of columnar conductors corresponding to the plurality of electronic component packages;
forming an insulating layer so as to cover the plurality of columnar conductors; and
polishing the insulating layer so that the plurality of columnar conductors are exposed.

24. The method according to claim 14, wherein:
the plurality of layer portions except the one farthest from the base include a flattened layer having a top surface that is flattened and that touches one of the layer portions disposed thereon; and
the step of fabricating the electronic component package substructure includes the step of forming the flattened layer.

25. The method according to claim 24, wherein:
the flattened layer includes a resin insulating film, and an inorganic insulating film that covers the resin insulating film and that has a flattened top surface; and
the step of forming the flattened layer includes the steps of:
forming the resin insulating film;
forming the inorganic insulating film so as to cover the resin insulating film; and
flattening the top surface of the inorganic insulating film.

26. The method according to claim 14, wherein:
one of the layer portions that is farthest from the base further includes a protection layer that covers the at least one electronic component chip included therein; and
the step of fabricating the electronic component package substructure includes the step of forming the protection layer.

27. The method according to claim 14, wherein the electronic component package further comprises a plurality of terminal conductor films disposed on the side surface of the base and respectively connected to the end faces of the external connecting terminals,
the method further comprising the step of forming the plurality of terminal conductor films after the step of cutting the electronic component package substructure.

28. The method according to claim 14, wherein the electronic component package further comprises a plurality of terminal pins respectively connected to the end faces of the external connecting terminals,
the method further comprising the step of connecting the terminal pins to the end faces of the external connecting terminals after the step of cutting the electronic component package substructure.

* * * * *

UNITED STATES PATENT AND TRADEMARK OFFICE
CERTIFICATE OF CORRECTION

PATENT NO. : 7,906,838 B2  
APPLICATION NO. : 11/878282  
DATED : March 15, 2011  
INVENTOR(S) : Yoshitaka Sasaki et al.

Page 1 of 1

It is certified that error appears in the above-identified patent and that said Letters Patent is hereby corrected as shown below:

Column 21,
Line 62, "layer portions the disposed on the wafer such that the" should read --layer portions disposed on the wafer such that--

Column 23,
Line 34, Claim 13 recitation of "according to claim 11" should read --according to claim 1--

Signed and Sealed this
Seventh Day of June, 2011

David J. Kappos
*Director of the United States Patent and Trademark Office*